(12) United States Patent
Kaushal et al.

(10) Patent No.: US 7,444,572 B2
(45) Date of Patent: Oct. 28, 2008

(54) BUILT-IN SELF TEST FOR A THERMAL PROCESSING SYSTEM

(75) Inventors: Sanjeev Kaushal, Austin, TX (US); Pradeep Pandey, San Jose, CA (US); Kenji Sugishima, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 658 days.

(21) Appl. No.: 11/217,276

(22) Filed: Sep. 1, 2005

(65) Prior Publication Data

US 2007/0061652 A1    Mar. 15, 2007

(51) Int. Cl.
*G01R 31/28* (2006.01)
*G06F 11/30* (2006.01)

(52) U.S. Cl. .................. 714/733; 702/182; 702/183; 702/185

(58) Field of Classification Search .................. 714/733; 702/182, 183, 185
See application file for complete search history.

(56) References Cited

U.S. PATENT DOCUMENTS

| | | |
|---|---|---|
| 5,642,296 A | 6/1997 | Saxena |
| 6,195,621 B1 | 2/2001 | Bottomfield ................ 702/183 |
| 6,351,723 B1 | 2/2002 | Maekawa ................... 702/185 |
| 6,803,548 B2 | 10/2004 | Wang et al. ................. 219/494 |

OTHER PUBLICATIONS

European Patent Office, International Search Report and Written Opinion for PCT/US2006/026128, 8 pp., Nov. 20, 2006.

*Primary Examiner*—John P Trimmings
*Assistant Examiner*—John J Tabone, Jr.
(74) *Attorney, Agent, or Firm*—Wood, Herron & Evans, LLP

(57) ABSTRACT

A method of creating and/or modifying a built-in self test (BIST) table for monitoring a thermal processing system in real-time that includes positioning a plurality of wafers in a processing chamber in the thermal processing system; executing a real-time dynamic model to generate a predicted dynamic process response; creating a measured dynamic process response; determining a dynamic estimation error; determining if the determined dynamic estimation error can be associated with a pre-existing BIST rule in the BIST table; creating a new BIST rule when the dynamic estimation error cannot be associated with any pre-existing BIST rule in the BIST table; and stopping the process when a new BIST rule cannot be created.

29 Claims, 7 Drawing Sheets

BUILT-IN SELF TEST FOR A THERMAL PROCESSING SYSTEM

FIELD OF THE INVENTION

This invention relates to methods for detection, diagnostics, and prediction of fault conditions for a thermal processing system employed in semiconductor processing.

BACKGROUND OF THE INVENTION

Faulty conditions in reactors employed in semiconductor manufacturing can lead to significant loss of revenue due to scrap and non-productive equipment downtime. In this regard, focus has been placed on equipment software that monitors operation of the equipment and creates alarms when unacceptable process excursions occur or other fault conditions are encountered.

However, what is needed is a method to determine the "health" of the equipment on an on-going basis so as to detect "emerging" fault conditions as well. Equipment and process engineers are asking the question—"How many more runs can I make before I need to do maintenance or repairs?" For example, take a batch furnace system used in semiconductor processing. For this equipment, some of the items the engineers are concerned about are: a) mass flow controller (MFC) drift; b) in-line mass flow meter (MFM) problems; c) leak rate; and d) heater elements.

In the past, both equipment manufacturers and chip manufacturers have relied on scheduled preventative maintenance (PM) of the equipment. However, this method is simply based on "rules of thumb" derived from average characteristics, such as mean time between failures (MTBF), and do not address detection, diagnosis, or prediction of faulty conditions for individual equipment.

Prior art includes several methods that attempt to detect equipment problems. One method described in Bottomfield, U.S. Pat. No. 6,195,621, relies on analyzing component vibration signature. However, this method is limited only to larger mechanical equipment that involves repetitive motion, such as pumps. This method does not address a majority of critical components, such as mass flow controllers, heaters, thermocouples, etc.

Another method described in Maekawa, U.S. Pat. No. 6,351,723, relies on extensions of previously known statistical process control (SPC) charts. However, this method focuses on single components and does not provide a system level detection or diagnosis. In addition, it does not address prediction at all.

SUMMARY OF THE INVENTION

The invention provides a method of creating and/or modifying a built-in self test (BIST) table for monitoring a thermal processing system in real-time. In one embodiment, the method includes: positioning a plurality of wafers at different heights in a processing chamber in the thermal processing system; creating a measured dynamic pre-processing process response while subjecting the plurality of wafers to a pre-processing process, wherein at least one first process parameter is changed from a first value to a second value within operating limits established for the pre-processing process; executing a pre-processing real-time dynamic model to generate a predicted dynamic pre-processing process response for the plurality of wafers when the at least one first process parameter is changed from the first value to the second value; determining a pre-processing dynamic estimation error for the pre-processing process using a difference between the predicted dynamic pre-processing process response and the measured dynamic pre-processing process response; and determining if the pre-processing dynamic estimation error can be associated with a pre-existing first BIST rule in the BIST table having one or more pre-existing first operational thresholds and first warning thresholds, and when the pre-processing dynamic estimation error cannot be associated with any pre-existing first BIST rule in the BIST table, either creating a new first BIST rule for the pre-processing process, or stopping the pre-processing process when a new first BIST rule cannot be created.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

A semiconductor processing system can include a thermal processing system. In accordance with the present invention, the thermal processing system can be monitored in real-time using a BIST table. In one embodiment, one or more process parameters are changed or maintained, responses thereto are predicted and measured, and an error estimation is determined and compared to operational thresholds and/or warning thresholds established by rules in the BIST table. The process can then be continued, paused or stopped depending on whether the error estimation is within the operational thresholds and/or within the warning thresholds.

In one embodiment of the present invention, a method is provided for the detection, diagnosis, and prediction of fault conditions to identify malfunction and error conditions in the semiconductor equipment as well as indicate drift and degradation that may lead to fault conditions.

In another or further embodiment, the present invention combines techniques from real-time modeling and estimation, which focus on time-series analysis, with a rule-based, inference system to create a novel "built-in self test" software application for a thermal processing system. Such thermal processing system can include chambers that can be hot-wall or cold-wall. These systems can be configured for single-wafer, multi-wafer, or batch operation, and can be used for processing various types of substrates, including silicon wafers and liquid crystalline display (LCD) panels.

In another or further embodiment, the present invention identifies malfunctions and/or error conditions in the thermal processing system as well as indicates drift and degradation that may be leading to an impending fault condition. Data to analyze the thermal processing system can be obtained either in a "Passive Mode", during a productive operation of the furnace, or in an "Active Mode," where periodic self-tests are conducted during idle time.

Figure 1:
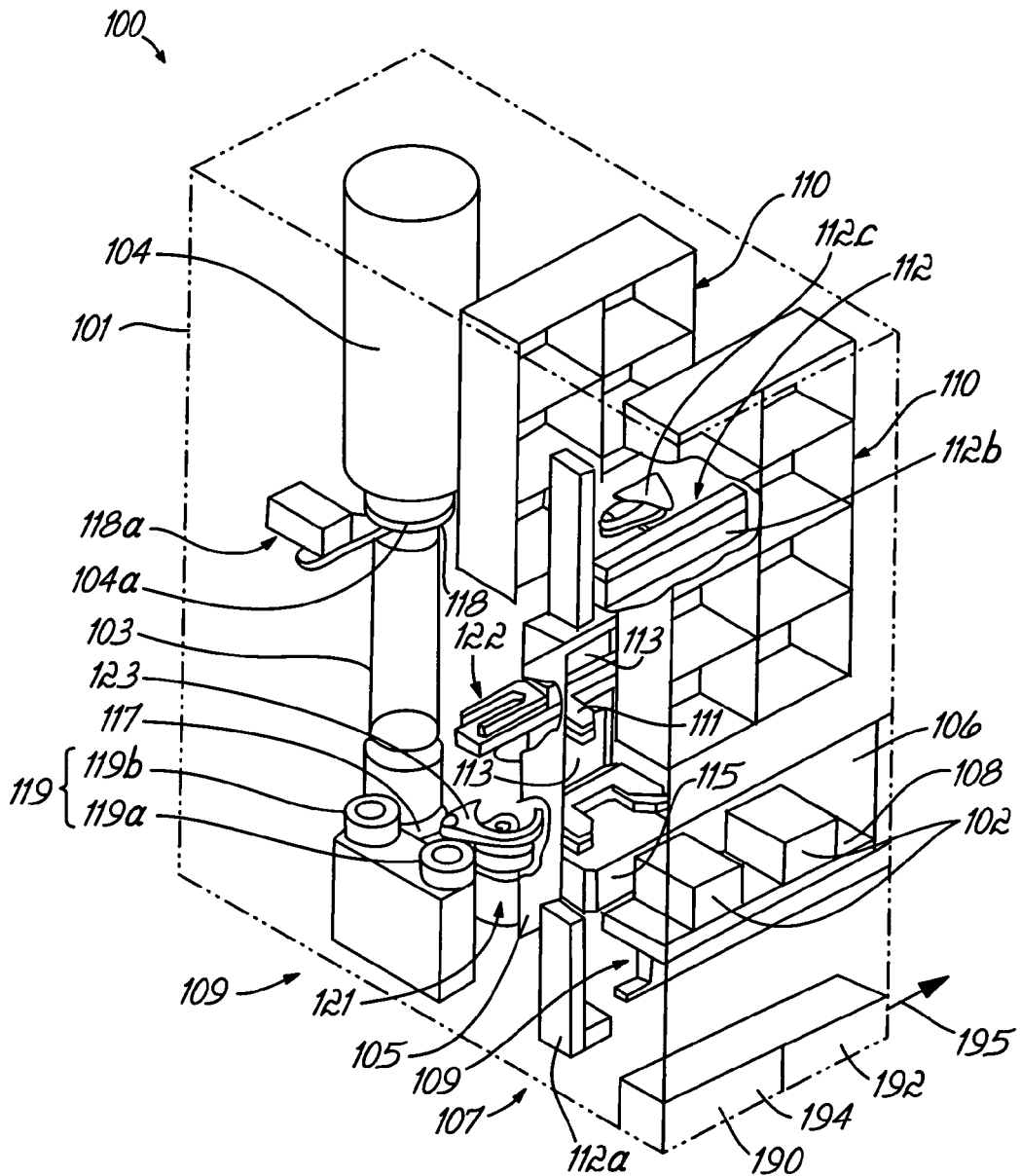
FIG. 1 is a schematic perspective view of a thermal processing system in accordance with embodiments of the invention.

The invention will now be described with reference to the drawings. FIG. 1 is a schematic perspective view of a thermal processing system in accordance with embodiments of the invention. The thermal processing system 100 can comprise a housing 101 that forms the outside walls of the thermal processing system when it is configured in a clean room. The interior of the housing 101 is divided by a partition (bulkhead) 105 into a carrier-transferring area 107 into and from which carriers 102 are conveyed and in which the carriers 102 are kept, and a loading area 109 where substrates to be processed (not shown), such as semiconductor wafers W, in the carriers 102 are transferred to boats 103 which are loaded into or unloaded from a vertical type thermal processing furnace (chamber) 104.

As shown in FIG. 1, an entrance 106 is provided in the front of the housing 101 for introducing and discharging the carriers 102 by an operator or an automatic conveying robot (not shown). The entrance 106 is provided with a door (not shown) that can move vertically to open and close the entrance 106. A stage 108 is provided near the entrance 106 in the carrier-transferring area 107 for placing the carriers 102 thereon.

As shown in FIG. 1, a sensor mechanism 109 is provided at the rear portion of the stage 108 for opening a lid (not shown) of the carrier 102 and detecting positions of and the number of the semiconductor wafers W. In addition, shelf-like storing sections 110 are formed above the stage 108 for storing a plurality of the carriers 102.

Two carrier-placing portions (transfer stages) 111 are provided in vertically spaced positions as tables for placing the carriers 102 thereon for transferring the semiconductor wafers W. Thus, the throughput of the thermal processing system 100 can be improved as one carrier 102 can be exchanged at one carrier-placing portion 111 while the semiconductor wafers W are transferred to another carrier 102 at the other carrier-placing portion 111.

A carrier transference mechanism 112 is arranged in the carrier-transferring area 107 for transferring the carriers 102 to and from the stage 108, the storing sections 110, and the carrier placing portions 111. The carrier transference mechanism 112 comprises: an elevating arm 112b which can be moved vertically by an elevating mechanism 112a provided on a side of the carrier-transferring area 107, and a transferring arm 112c mounted on the elevating arm 112b for supporting the bottom of the carrier 102 to horizontally transfer the carrier 102.

For example, the carrier 102 can be a closed type, which can house 13 or 25 wafers and which can be hermetically closed by a lid (not shown). The carrier 102 can comprise a portable plastic container for housing and holding wafers W in multistairs in horizontal attitude and in vertically spaced relation by a prescribed pitch. In one embodiment, the diameter of the wafer W can be 300 mm. Alternately, other wafer sizes may be used. The lid (not shown) is removably attached at the wafer-entrance formed in the front of the carrier 102 in such a manner that the lid can sealingly close the wafer-entrance.

Clean atmospheric air, which has passed through filters (not shown), can be provided into the carrier-transferring area 107, so that the carrier-transferring area 107 is filled with the clean atmospheric air. In addition, clean atmospheric air can also be provided into the loading area 109, so that the loading area 109 is filled with the clean atmospheric air. Alternately, an inert gas, such as nitrogen ($N_2$), is supplied into the loading area 109, so that the loading area is filled with the inert gas.

As shown in FIG. 1, the partition 105 has two openings 113, upper and lower, for transferring a carrier 102. The openings 113 can be aligned with the carrier-placing portions 111. Each opening 113 is provided with a lid (not shown) for opening and closing the opening 113. The opening 113 is formed in such a manner that the size of the opening 113 is substantially the same as that of the wafer-entrance of the carrier 102, so that semiconductor wafers W can be transferred into and from the carrier 102 through the opening 113 and the wafer-entrance.

In addition, a notch aligning mechanism 115 is arranged below the carrier-placing portions 111 and along a vertical central line of the carrier-placing portion 111 for aligning notches (cut portions) provided at peripheries of the semiconductor wafers W i.e. for aligning the crystalline directions of the semiconductor wafers W. The notch aligning mechanism 115 has an opening on the side of the loading area 107. The notch aligning mechanism 115 is adapted to align the notches of the semiconductor wafers W transferred from the carrier 102 on the carrier-placing portion 111 by the transferring mechanism 122.

The notch aligning mechanism 115 has two apparatus in vertically spaced positions, and each apparatus can align the notches of the wafers. Thus, the throughput of the thermal processing system 100 can be improved because one apparatus can transfer back the aligned wafers to the boat 103 while the other apparatus aligns other wafers. Each apparatus may be adapted to align plural, for example three or five wafers at a time, such that the time for transferring the wafers can be substantially reduced.

The thermal processing furnace 104 is disposed in a rear and upper portion in the loading area 109. The thermal processing furnace 104 has a furnace opening 104a in the bottom thereof. A lid 117 is provided below the furnace 104. The lid 117 is adapted to be vertically moved by an elevating mechanism (not shown) for loading a boat 103 into and unloading it from the furnace 104 and for opening and closing the furnace opening 104a. The boat 103, which can hold a large number of, for example 100 or 150 semiconductor wafers W in vertical equally spaced multistairs, is adapted to be placed on the lid 117. The boat 103 is made of crystal or the like. The thermal processing furnace 104 is provided with a shutter 118 at the furnace opening 104a for closing the furnace opening 104a while the lid 117 is taken off and the boat 103 is unloaded after the thermal processing. The shutter 118 is adapted to horizontally pivot to open and close the furnace opening 104a. A shutter driving mechanism 118a is provided to make the shutter 118 pivot.

Still referring to FIG. 1, a boat-placing portion (boat stage) 119 is disposed in a side region of the loading area 109 for placing the boat 103 thereon when transferring semiconductor wafers W into and from the boat 103. The boat-placing portion 119 has a first placing portion 119a and a second placing portion 119b arranged between the first placing portion 119a and the lid 117. A ventilating unit (not shown) is disposed adjacent the boat-placing portion 119 for cleaning the circulation gas (the clean atmospheric air or the inert gas) in the loading area 109 using filters.

A boat-conveying mechanism 121 is arranged between the carrier-placing portion 111 and the thermal processing furnace 104 in the lower portion in the loading area 109 for conveying the boat 103 between the boat-placing portion 119 and the lid 117. Specifically, the boat-conveying mechanism 121 is arranged for conveying the boat 103 between the first placing portion 119a or the second placing portion 119b and the lowered lid 117, and between the first placing portion 119a and the second placing portion 119b.

A transferring mechanism 122 is arranged above the boat-conveying mechanism 121 for transferring semiconductor wafers W between the carrier 102 on the carrier-placing portion 111 and the boat 103 on the boat-placing portion 119, and more specifically, between the carrier 102 on the carrier-placing portion 111 and the notch aligning mechanism 115, between the notch aligning mechanism 115 and the boat 103 on the first placing portion 119a of the boat-placing portion 119, and between the boat 103 after the thermal processing on the first placing portion 119a and the vacant carrier on the carrier-placing portion 111.

As shown in FIG. 1, the boat conveying mechanism 121 has an arm 123 which can support one boat 103 vertically and move (expand and contract) horizontally. For example, the boat 103 can be conveyed in a radial direction (a horizontal linear direction) with respect to the rotational axis of the arm 123 by synchronously rotating the arm 123 and a support arm (not shown). Therefore, the area for conveying the boat 103 can be minimized, and the width and the depth of the thermal processing system 100 can be reduced.

The boat conveying mechanism 121 conveys a boat 103 of unprocessed wafers W from the first placing portion 119a to the second placing portion 119b. Then, the boat conveying mechanism 121 conveys a boat 103 of processed wafers W from the lid 117 to the first placing portion 119a. Then, the boat conveying mechanism 121 conveys the boat 103 of unprocessed wafers W onto the lid 117. In this manner, the unprocessed wafers W are prevented from being contaminated by particles or gases coming from the boat 103 of processed wafers W.

When a carrier 102 is placed on the stage 108 through the entrance 106, the sensor mechanism 109 detects the placing state of the carrier 102. Then, the lid of the carrier 102 is opened, and the sensor mechanism 109 detects positions of and the number of the semiconductor wafers W in the carrier 102. Then, the lid of the carrier 102 is closed again, and the carrier 102 is conveyed into the storing section 110 by means of the carrier transference mechanism 112.

A carrier 102 stored in the storing section 110 is conveyed onto the carrier-placing portion 111 at a suitable time by means of the carrier transference mechanism 112. After the lid of the carrier 102 on the carrier-placing portion 111 and the door of the opening 113 of the partition 105 are opened, the transferring mechanism 122 takes out semiconductor wafers W from the carrier 102. Then, the transferring mechanism 122 transfers them successively into a vacant boat 103 placed on the first placing portion 119a of the boat-placing portion 119 via the notch aligning mechanism 115. While the wafers W are transferred, the boat conveying mechanism 121 is lowered to evacuate from the transferring mechanism 122, so that the interference of the boat conveying mechanism 121 and the transferring mechanism 122 is prevented. In this manner, the time for transferring the semiconductor wafers W can be reduced, so that the throughput of the thermal processing system 100 can be substantially improved.

After the transference of the wafers W is completed, the transferring mechanism 122 can move laterally from an operating position to a holding position in the other side region of the housing 101.

After the thermal processing is completed, the lid 117 is lowered, and the boat 103 and the thermally processed wafers are moved out of the furnace 104 into the loading area 109. The shutter 118 hermetically closes the opening 104a of the furnace immediately after the lid 117 is taken off with the boat 103. This minimizes the heat transfer out of the furnace 104 into the loading area 109, and minimizes the heat transferred to the instruments in the loading area 109.

After the boat 103 containing the processed wafers W is conveyed out from the furnace 104, the boat conveying mechanism 121 conveys another boat 103 of unprocessed wafers W from the first placing portion 119a to the second placing portion 119b. Then, the boat conveying mechanism 121 conveys the boat 103 containing the processed wafers W from the lid 117 to the first placing portion 119a. Then, the boat conveying mechanism 121 conveys the boat 103 of unprocessed wafers from the second placing portion 119b onto the lid 117. Therefore, the unprocessed semiconductor wafers W in the boat 103 are prevented from being contaminated by particles or gases coming from the boat 103 of processed wafers W when the boats 103 are moved.

After the boat 103 of unprocessed wafers W is conveyed onto the lid 117, the boat 103 and the lid 117 are introduced into the furnace 104 through the opening 104a after the shutter 118 is opened. The boat 103 of unprocessed wafers W can then be thermally processed. In addition, after the boat 103 of processed wafers W is conveyed onto the first placing portion 119a, the processed semiconductor wafers W in the boat 103 are transferred back from the boat 103 into the vacant carrier 102 on the carrier-placing portion 111 by means of the transferring mechanism 122. Then, the above cycle is repeated.

Setup, configuration, and/or operational information can be stored by the thermal processing system 100, or obtained from an operator or another system, such as a factory system. BIST rules and tables can be used to specify the action taken for normal processing and the actions taken on exceptional conditions. Configuration screens can be used for defining and maintaining BIST rules. The BIST rules can be stored and updated as required. Documentation and help screens can be provided on how to create, define, assign, and maintain the BIST rules.

BIST rules can be used to determine when a process is paused and/or stopped, and what is done when a process is paused and/or stopped. In addition, BIST rules can be used to determine when to change a process and how to change the process. Furthermore, rules can be used to determine when to select a different dynamic/static model and how to create a BIST rule in the process. In general, BIST rules allow system operation to change based on the dynamic state of the system.

In one embodiment, thermal processing system 100 can comprise a system controller 190 that can include a processor 192 and a memory 194. Memory 194 can be coupled to processor 192, and can be used for storing information and instructions to be executed by processor 192. Alternately, different controller configurations can be used. In addition, system controller 190 can comprise a port 195 that can be used to couple thermal processing system 100 to another system (not shown). Furthermore, controller 190 can comprise input and/or output devices (not shown) for coupling the controller 190 to other elements of the system.

In addition, the other elements of the system can comprise processors and/or memory (not shown) for executing and/or storing information and instructions to be executed during processing. For example, the memory may be used for storing temporary variables or other intermediate information during the execution of instructions by the various processors in the system. One or more of the system elements can comprise the means for reading data and/or instructions from a computer readable medium. In addition, one or more of the system elements can comprise the means for writing data and/or instructions to a computer readable medium.

Memory devices can include at least one computer readable medium or memory for holding computer-executable instructions programmed according to the teachings of the invention and for containing data structures, tables, records, rules, or other data described herein. System controller 190 can use data from computer readable medium memory to generate and/or execute computer executable instructions. The thermal processing system 100 can perform a portion or all of the methods of the invention in response to the system controller 190 executing one or more sequences of one or more computer-executable instructions contained in a memory. Such instructions may be received by the controller from another computer, a computer readable medium, or a network connection.

Stored on any one or on a combination of computer readable media, the present invention includes software for controlling the thermal processing system 100, for driving a device or devices for implementing the invention, and for enabling the thermal processing system 100 to interact with a human user and/or another system, such as a factory system. Such software may include, but is not limited to, device drivers, operating systems, development tools, and applications software. Such computer readable media further includes the computer program product of the present invention for performing all or a portion (if processing is distributed) of the processing performed in implementing the invention.

In addition, at least one of the elements of the thermal processing system 110 can comprise a graphic user interface (GUI) component (not shown) and/or a database component (not shown). In alternate embodiments, the GUI component and/or the database component are not required. The user interfaces for the system can be web-enabled, and can provide system status and alarm status displays. For example, a GUI component (not shown) can provide easy-to-use interfaces that enable users to: view status; create and edit SPC charts; view alarm data; configure data collection applications; configure data analysis applications; examine historical data, and review current data; generate e-mail warnings; run multivariate models; view diagnostics screens; and view/create/edit BIST rules and tables in order to more efficiently troubleshoot, diagnose, and report problems with the thermal processing system 100.

Figure 2:
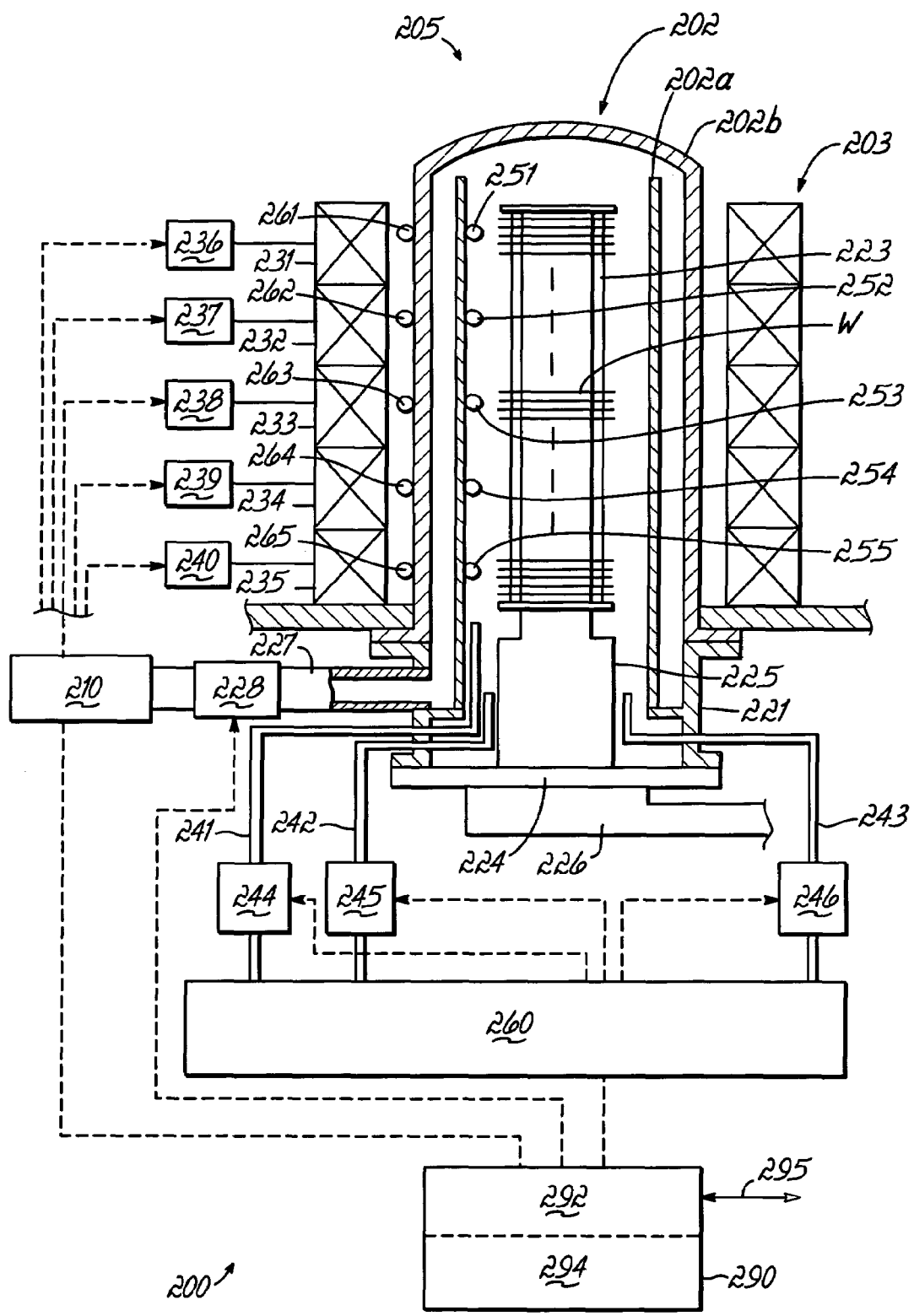
FIG. 2 is a partial cut-away view of a portion of the thermal processing system in accordance with embodiments of the invention.

FIG. 2 is a partial cut-away view of a portion of a thermal processing system 200 in accordance with embodiments of the invention. In the illustrated embodiment, a furnace system 205, an exhaust system, 210, a gas supply system 260, and a controller 290 are shown.

The furnace system 205 can comprise a vertically oriented processing chamber (reaction tube) 202 having a double structure including an inner tube 202a and an outer tube 202b which are formed of, e.g., quartz, and a cylindrical manifold 221 of metal disposed on the bottom of processing chamber 202. The inner tube 202a has the top interrupted, opened and is supported by the manifold 221. The outer tube 202b has the top uninterrupted, closed and has the lower end sealed airtight to the upper end of the manifold 221.

In the processing chamber 202, a number of wafers W (e.g., 150) are mounted on a wafer boat 223 (wafer holder), horizontally one above the other at a certain pitch in a shelves-like manner. The wafer boat 223 is held on a lid 224 through a heat insulation cylinder (heat insulator) 225, and the lid 224 is coupled to moving means 226.

The furnace system 205 can also comprise a heater 203 in the form of, e.g., a resistor disposed around the processing chamber 202. The heater 203 can comprise five stages of heaters 231-235. Alternately, a different heater configuration can be used. The respective heater stages 231-235 are supplied with electric power independently of one another from their associated electric power controllers 236-240. The heater stages 231-235 can be used to divide the interior of the processing chamber 202 into five zones.

A gas supply system 260 is shown coupled to the controller 290 and the furnace system 205. The manifold 221 has a plurality of gas feed pipes 241-243 for feeding gases into the inner tube 202a. In one embodiment, dichlorosilane, ammonium, and nitrogen can be fed to the respective gas feed pipes 241, 242, 243 through flow rate adjusters 244, 245, 246, such as mass flow controllers (MFCs). Alternately, other process gasses may be used.

An exhaust pipe 227 is connected to the manifold 221 for the exhaustion through the gap between the inner pipe 202a and the outer pipe 202b. The exhaust pipe 227 is connected to an exhaust system 210 that can include a vacuum pump (not shown). A pressure adjuster 228 including a combination valve, a butterfly valve, valve drivers, etc. is inserted in the exhaust pipe 227 for adjusting a pressure in the processing chamber 202.

The furnace system 205 can also comprise a number of sensors. In the illustrated embodiment, five inner temperature sensors (thermocouples) 251-255 are disposed on the inside of the inner tube 202a in vertical alignment with each other. The inner temperature sensors 251-255 are covered with, e.g., quartz pipes for the prevention of metal contamination of semiconductor wafers W. The inner temperature sensors 251-255 are arranged corresponding to the five zones. Alternately, a different number of zones may be used, a different number of inner temperature sensors may be used, and the inner sensors may be positioned differently. In another embodiment, optical techniques can be used to measure temperature.

A plurality of outer temperature sensors (thermocouples/temperature meters) 261-265 are disposed on the outside of the outer pipe 202b in vertical alignment with each other. The outer temperature sensors 261-265 can also be arranged corresponding to the five zones. Alternately, a different number of zones may be used, a different number of outer temperature sensors may be used, and the outer sensors may be positioned differently.

The controller 290 can be used to control treatment parameters, such as a temperature of a treatment atmosphere, a gas flow rate and pressure in the processing chamber 202. The controller 290 receives output signals of the inner temperature sensors 251-255 and outer temperature sensors 261-265 to output control signals to the electric power controllers 236-240, the pressure adjuster 228 and the flow rate adjusters 244-246.

Setup, configuration, and/or operational information can be stored by the controller 290, or obtained from an operator or another controller, such as a controller 190 (FIG. 1). Controller 290 can also use BIST rules and tables to determine the action taken for normal processing and the actions taken on exceptional conditions. Configuration screens can be used for defining and maintaining BIST rules. Controller 290 can store and update the BIST rules as required. Documentation and help screens can be provided on how to create, define, assign, and maintain the BIST rules.

Controller 290 can use BIST rules and tables to determine when a process is paused and/or stopped, and what is done when a process is paused and/or stopped. In addition, BIST rules can be used to determine when to change a process and how to change the process. Furthermore, rules can be used to determine when to select a different dynamic/static model and how to create a BIST rule in the process. In general, BIST rules allow system operation to change based on the dynamic state of the system.

In one embodiment, controller 290 can include a processor 292 and a memory 294. Memory 294 can be coupled to processor 292, and can be used for storing information and instructions to be executed by processor 292. Alternately, different controller configurations can be used. In addition, system controller 290 can comprise a port 295 that can be used to couple controller 290 to another computer and/or network (not shown). Furthermore, controller 290 can comprise input and/or output devices (not shown) for coupling the controller 290 to the furnace system 205, exhaust system, 210, and gas supply system 260.

Controller 290 can comprise the means for reading data and/or instructions from a computer readable medium. In addition, controller 290 can comprise the means for writing data and/or instructions to a computer readable medium.

Memory 294 can include at least one computer readable medium or memory for holding computer-executable instructions programmed according to the teachings of the invention and for containing data structures, tables, records, rules, or other data described herein. Controller 290 can use data from computer readable medium memory to generate and/or execute computer executable instructions. The furnace system 205, exhaust system, 210, a gas supply system 260, and a controller 290 can perform a portion or all of the methods of the invention in response the execution of one or more sequences of one or more computer-executable instructions contained in a memory. Such instructions may be received by the controller from another computer, a computer readable medium, or a network connection.

Stored on any one or on a combination of computer readable media, the present invention includes software for controlling the furnace system 205, exhaust system, 210, gas supply system 260, and a controller 290, for driving a device or devices for implementing the invention, and for enabling one or more of the system components to interact with a human user and/or another system. Such software may include, but is not limited to, device drivers, operating systems, development tools, and applications software. Such computer readable media further includes the computer program product of the present invention for performing all or a portion (if processing is distributed) of the processing performed in implementing the invention.

Controller 290 can comprise a GUI component (not shown) and/or a database component (not shown). In alternate embodiments, the GUI component and/or the database component are not required. The user interfaces for the system can be web-enabled, and can provide system status and alarm status displays. For example, a GUI component (not shown) can provide easy to use interfaces that enable users to: view status; create and edit charts; view alarm data; configure data collection applications; configure data analysis applications; examine historical data, and review current data; generate e-mail warnings; view/create/edit/execute dynamic and/or static models; view diagnostics screens; and view/create/edit BIST rules and tables in order to more efficiently troubleshoot, diagnose, and report problems.

During a first processing time, the controller 290 can cause the pressure in the processing chamber 202 to be changed from one pressure to another pressure. A real-time dynamic pressure model can be established for this particular system configuration based on the type of vertical wafer boat 223, the type, position, and quantity of wafers W, the type of thermal processing chamber 202, and the recipe to be performed.

The real-time dynamic pressure model can be executed to generate a predicted dynamic pressure response for the processing chamber during the first processing time. In addition, a measured dynamic pressure response can be created for the processing chamber during the first processing time, and a dynamic estimation error can be determined using a difference between the predicted dynamic pressure response and the measured dynamic pressure response. Furthermore, the dynamic estimation error can be compared to operational thresholds established by one or more rules in a BIST table. The process can be stopped when the dynamic estimation error is not within operational thresholds established by at least one of the rules in the BIST table, and the process can continue when the dynamic estimation error is within operational thresholds established by at least one of the rules in the BIST table.

During a second processing time, the controller 290 can cause the temperature in the processing chamber to be changed from one temperature to another temperature. For example, controller 290 can execute a heater control model designed to estimate temperatures of wafers W mounted on the wafer boat 223 in the respective zones. The controller 290 can compare the estimated temperatures with measured temperatures, and, based on a comparison result, correct the estimated temperatures of the wafers W. Techniques for controlling a heating apparatus using models are disclosed in U.S. Pat. No. 6,803,548, entitled "Batch-type Heat Treatment Apparatus and Control Method for the Batch-type Heat Treatment Apparatus, filed on Sep. 13, 2001, which is incorporated by reference herein.

One or more real-time dynamic temperature models can be executed to generate a predicted dynamic temperature response for the processing chamber 202 during the second processing time. In addition, one or more measured dynamic temperature responses can be created for the processing chamber 202 during the second processing time, and a dynamic estimation error can be determined using a difference between a predicted dynamic temperature response and a measured dynamic temperature response. Furthermore, the dynamic estimation error can be compared to operational thresholds established by one or more rules in a BIST table. The process can be stopped when the dynamic estimation error is not within operational thresholds established by at least one of the rules in the BIST table, and the process can continue when the dynamic estimation error is within operational thresholds established by at least one of the rules in the BIST table.

Controller 290 can also create a measured static and/or dynamic response using data from the inner temperature sensors 251-255, the outer temperature sensors 261-265, the electric power controllers 236-240, the pressure adjuster 228, or the flow rate adjusters 244-246, or a combination thereof.

During operation, temperatures of wafers W in the respective zones are estimated, and adaptive methods are used to control the heater stages 231-235 so that the corrected wafer temperatures can be equal to temperatures indicated by the recipe. When the temperature increase is completed, the adaptive control is used to retain temperatures of the respective zones.

During a third processing time, after the temperatures in the processing chamber 202 have stabilized, processing gases are fed into the processing chamber 202, a film forming process is started, and the temperature control is maintained so that temperatures of the wafers W in the respective zones can be approximately equal to the set temperatures of the temperature recipe. The wafers W in the different zones can be processed at the different temperatures. However, the models and the recipes have values that are adjusted so that films of relatively uniform thicknesses are deposited on the different planes of wafers W.

One or more real-time dynamic process models can be executed to generate a predicted dynamic process response for the processing chamber 202 during the third processing time. A real-time dynamic model can be executed to generate a predicted dynamic gas flow response, a predicted dynamic temperature response, or a predicted dynamic pressure response, or a combination thereof for the processing chamber 202 during the third processing time. In addition, one or more measured dynamic process responses can be created for the processing chamber 202 during the third processing time, and a dynamic estimation error can be determined using a difference between a predicted dynamic temperature response and a measured dynamic temperature response. Furthermore, the dynamic estimation error can be compared to operational thresholds established by one or more rules in a BIST table. The process can be stopped when the dynamic estimation error is not within operational thresholds established by at least one of the rules in the BIST table, and the process can continue when the dynamic estimation error is within operational thresholds established by at least one of the rules in the BIST table.

When the film growth is completed, the feed of the film forming gases is stopped, and the interior of the processing chamber 202 is cooled. During the cooling, temperatures of the wafers W are estimated as required, and the estimated temperatures are corrected. When the treatment is over, the treated wafer boat 223 is unloaded.

During processing, a product, such as a wafer or LCD substrate, is processed by the semiconductor processing system and can move from one processing element to another processing element.

Figure 3:
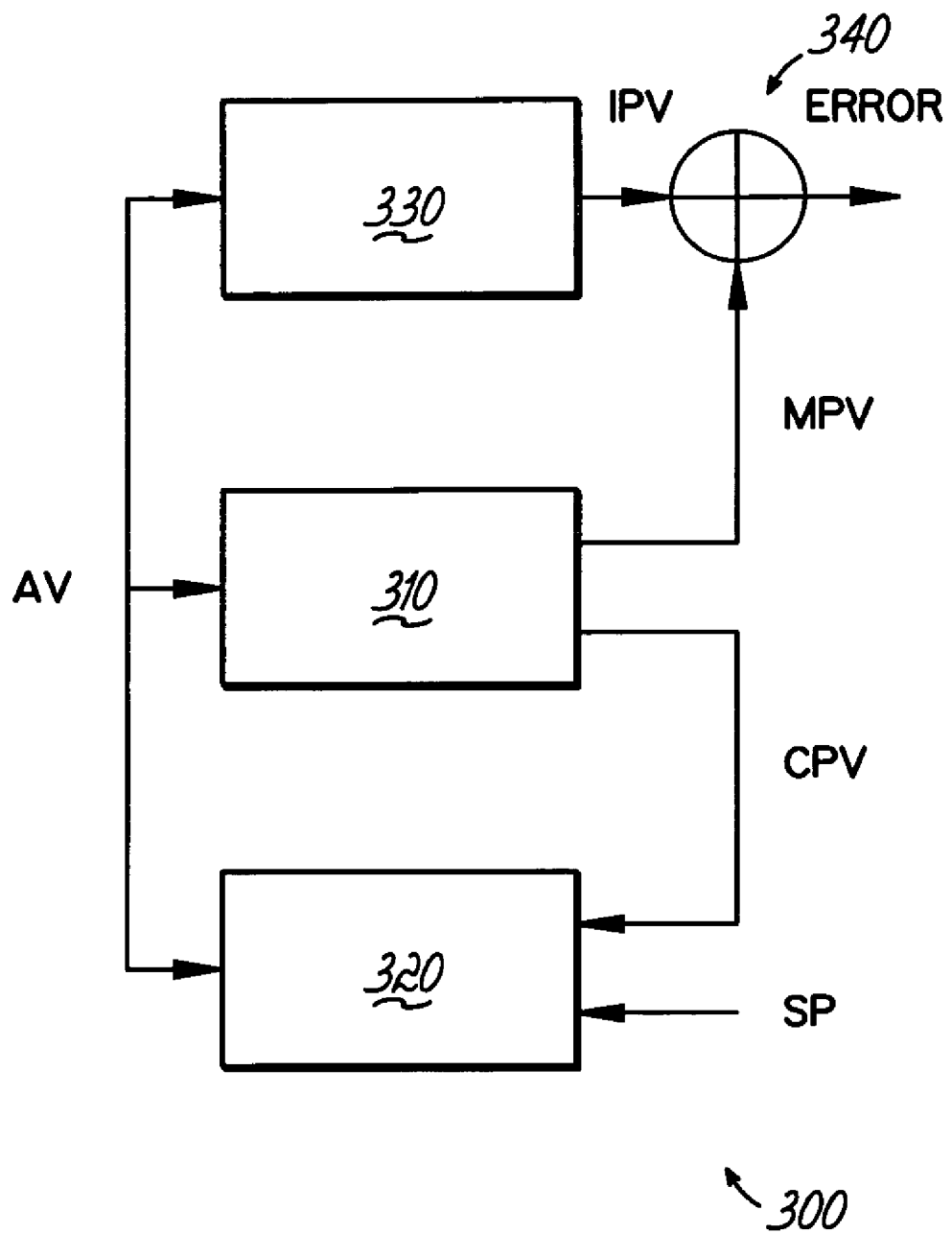
FIG. 3 illustrates a simplified block diagram of a processing system in accordance with embodiments of the invention.

FIG. 3 illustrates a simplified block diagram of a processing system in accordance with embodiments of the invention. In the illustrated embodiment, a processing system 300 is shown that comprises a system 310, a controller 320, a dynamic model 330, and a comparator 340. In addition, actuation variables (AV) are shown, and these are the variables that have a fixed setpoint (SP) in the recipe or are generated in real-time by a controller based on a setpoint in the recipe. For example, heater power, mass flow rate, and exhaust valve angle.

Two types of process variables (PV) are illustrated, and these are process conditions in the equipment as a result of the actuation variables. Examples of process variables include paddle or wafer temperatures, reactant concentration at the substrates, and film thickness on the substrate. The process variables can be classified as: measured process variables (MPV) that are measured using sensors and general process variables (GPV) that are not measured by sensors. Of the ones that are measured, some can be directly controlled via a controller—these are controlled process variables (CPV).

The AV, MPV, and SP are available in real-time. By definition, the GPV are not available (not measured); their effect may be deduced only by end-of-run measurements. For example, in a batch furnace, real-time data is available for chamber pressure, mass flow rates and their setpoints, valve angles, and chamber temperature for each zone.

During system operation, error conditions can occur. For example, the types of error conditions can include a component failure, where an active, passive, or software component fails to perform a required task; a component degradation, where the performance of an active, passive, or software component is degraded, and a failure can occur in the near future if the degraded performance is not corrected; and a configurations error, where an active, passive, or software component is not configured properly.

The thermal processing system and/or the system components can be in one of two states when operational, a processing state in which the system and/or the system components are processing wafers and/or substrates; and an idle state in which the system and/or one or more of the system components are waiting to process wafers and/or substrates. In an alternate embodiment, a maintenance state may also be used in which the system and/or one or more of the system components is off-line for a maintenance, calibration, and/or repair time.

These two states provide unique opportunities to perform BIST related operations. In the passive mode, during the processing state, one or more of the processes can "observe" the real-time system response, but cannot make changes to the processing conditions. For example, the system response can be observed, and processing conditions and error conditions can be determined. In addition, dynamic and/or static models can be executed, and BIST rules can be verified or new BIST rules can be created.

In the idle mode, one or more of the processes can make changes to the processing conditions since no product substrates are being processed. During the idle mode, one or more of the processes can create processing conditions as necessary to detect and diagnose degradations and fault conditions. These degradations and fault conditions can be used to create and/or modify one or more BIST rules. In particular, one or more of the processes may select process parameters to magnify an error condition, rather than to hide or compensate for it. In the idle mode, the system can be operated-using production conditions, or the system can be operated using non-production conditions (e.g., no wafers in the chamber, no reactant gases flowing, etc.) In addition, one level of tests can be conducted at the component level, and these tests can also be static or dynamic. For example, heater resistance can be monitored for signs of any degradation.

Static measurements are one way to detect errors. However, drift and degradation may be small for multiple parameters, but they have an overall impact on system performance.

The system dynamic performance is a composite picture of the system parameters that can be dependent on a number of variables. For example, system thermal response can be a function of an active, passive, or software component. Deviation in one or more of these components can lead to errors. For better detection and diagnosis, a "system level" approach can be used.

Recipes can be used in a system level, and a typical recipe provides the setpoints (SP) for the measured process variables (MPV), including the controlled process variables (CPV), and the system controller can control the actuation variables (AV) to reduce the error between the CPV and SP, where the Error=SP−CPV.

In addition, rules can be used to specify an acceptable range of the CPV during certain critical steps. An alarm is generated if the CPV goes out of this range. For example:

$$CPV-\text{Lower Bound }(LB) > \text{Alarm Operational threshold} \quad (1)$$

$$\text{Upper Bound }(UB) - CPV > \text{Alarm Operational threshold} \quad (2)$$

However, this approach only determines the controllers "ability" to keep the error small—it does not determine if the equipment is functioning properly. In particular, it does not address what is happening with the general process variables, and hence, the end-of-run parameters.

In one embodiment, BIST rules are used to determine if the system and/or the system components are behaving "as-designed" from the real-time data and dynamic models of the system components. Dynamic models provide the response of the system "as designed," and can be used for detecting error conditions. For example, an error can be computed using the difference between the modeled response (IPV) and the measured response as shown below:

$$\text{Error}=IPV-MPV$$

An alarm is created if this error is greater than pre-set operational thresholds. The operational thresholds can be part of a BIST table.

In an "active mode", BIST can be used to create conditions to magnify the error between the modeled response and measured response in the appropriate regime of the PV. In such dynamic conditions, variation between the modeled and measured is amplified. Under static or steady conditions, the errors appear as "bias" errors and can be swamped by measurement noise. Active mode can significantly increase the probability of true alarms.

For example, for a batch furnace, the models used for BIST relate various real-time data sets collected from the furnace; these include setpoints, MFC flow rates, pressure measurements from the 0-10 Torr and 0-1000 Torr gauges, valve angle, and pressure control parameters.

The models include both dynamic (transient) and steady-state behavior. For example, dynamic behavior models pressure rise rate. To describe the mathematical model further, notation shown in Table 1 can be used:

TABLE 1

| Parameter | Description |
|---|---|
| $g_i$ | $i^{th}$ MFC gas flow rate (sccm) |
| v | Valve angle opening (%) |
| p | Chamber pressure (mTorr) |

The chamber pressure rise (change) rate $\dot{p}$ as a function $f$ of gas flows and valve angle can be modeled as follows:

$$\dot{p}=f_1(g_1, g_2, \ldots, g_n, v)$$

A special condition exists when the valve is fully closed—in this case, the pressure rise rate becomes independent of the pressure controller. For this condition, the chamber pressure rise rate $\dot{p}$ can be:

$$\dot{p}=f_1(g_1, g_2, \ldots, g_n, v=0)$$

Given this model, one method for individually estimating MFC flow rates is:

$$g_i=f_1^{-1}(\dot{p})$$

In addition, the steady-state behavior can be modeled as follows:

$$p=f_2(g_1, g_2, \ldots, g_n, v)$$

This model can be used to estimate a parameter given the rest of the parameters, that is:

$$g_i=f_2^{-1}(p, v),$$

$$v=f_2^{-1}(g_1, g_2, \ldots, g_n, p), \text{ and}$$

$$p=f_2(g_1, g_2, \ldots, g_n, v)$$

Thus, these models provide multiple estimates of the process parameters. The inference logic finds a consistent set of explanation for the estimated parameters to generate diagnostics.

In one embodiment, a method can be established to capture the dynamic and steady-state behavior of the furnace gas-flow system. The method involves running a "model-development" recipe on the furnace. The recipe is designed to operate under a variety of conditions, as follows: 1) system dynamic response under automatic pressure control (APC); 2) system dynamic and steady-state response under manual valve control (MVC); 3) base pressure with valve fully open; and 4) leak rate with valve fully closed.

In the set of tests to determine the system response under APC, the pressure setpoint can be changed, and the change in chamber pressure for various gas flow rates can be analyzed. For example, the following changes can be made:

1) Step change in pressure setpoint from 0 to 3 Torr,
2) Step change from 3 to 6 Torr, and
3) Step change from 6 to 9 Torr.

Figure 4:
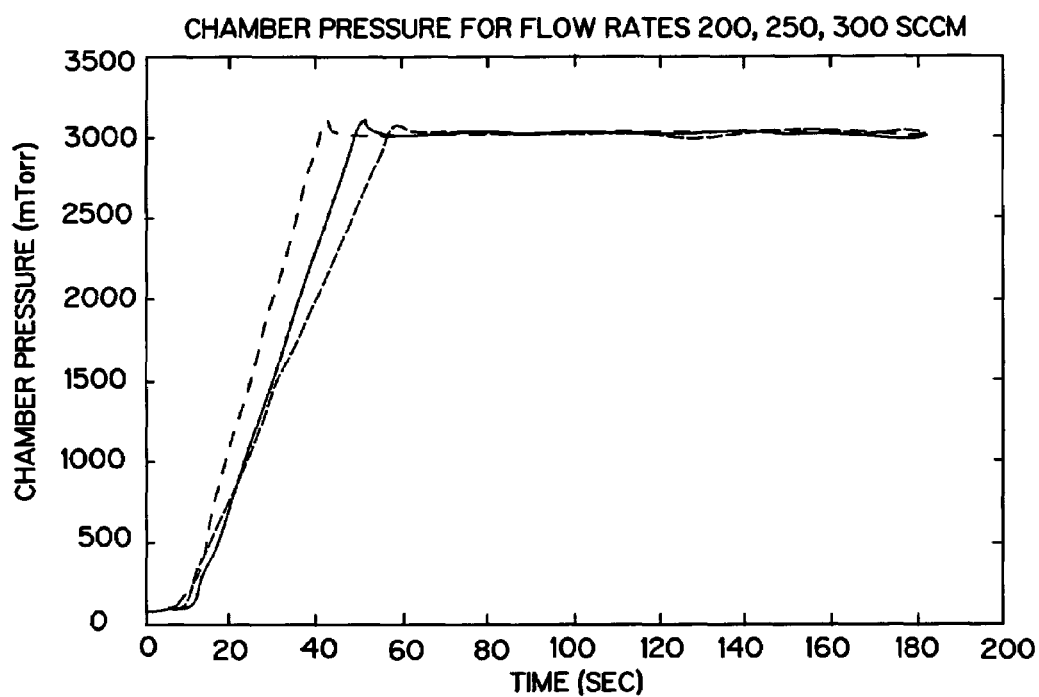
FIG. 4 shows the chamber pressure transient behavior for a first pressure setpoint change in accordance with embodiments of the invention.
Figure 5:
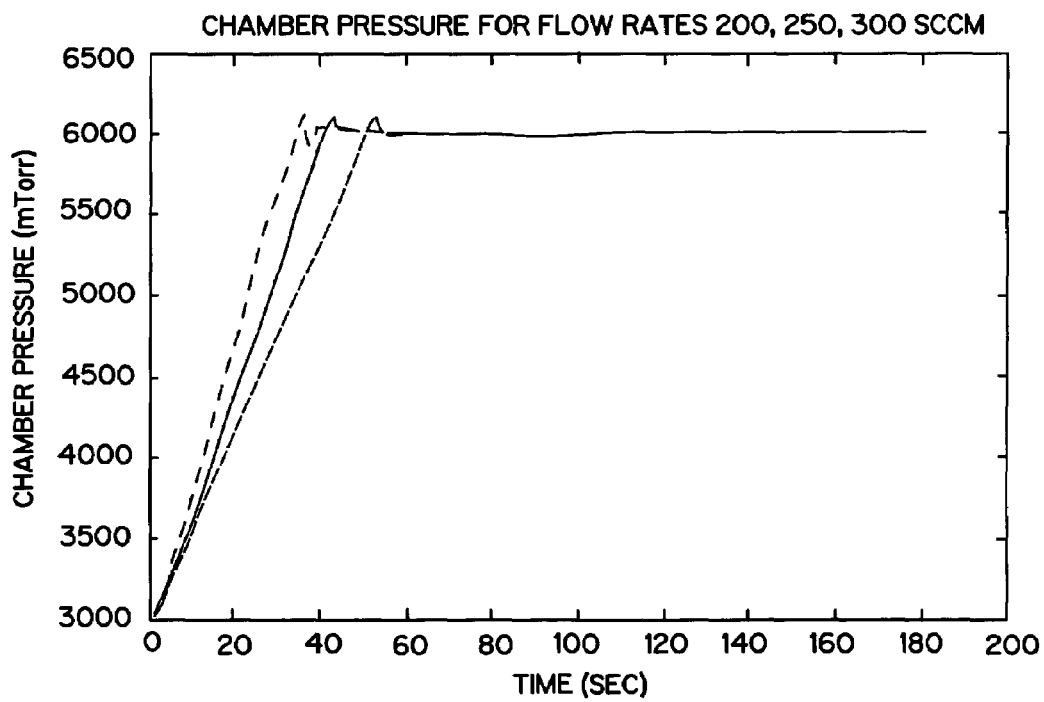
FIG. 5 shows the chamber pressure transient behavior for a second pressure setpoint change in accordance with embodiments of the invention.
Figure 6:
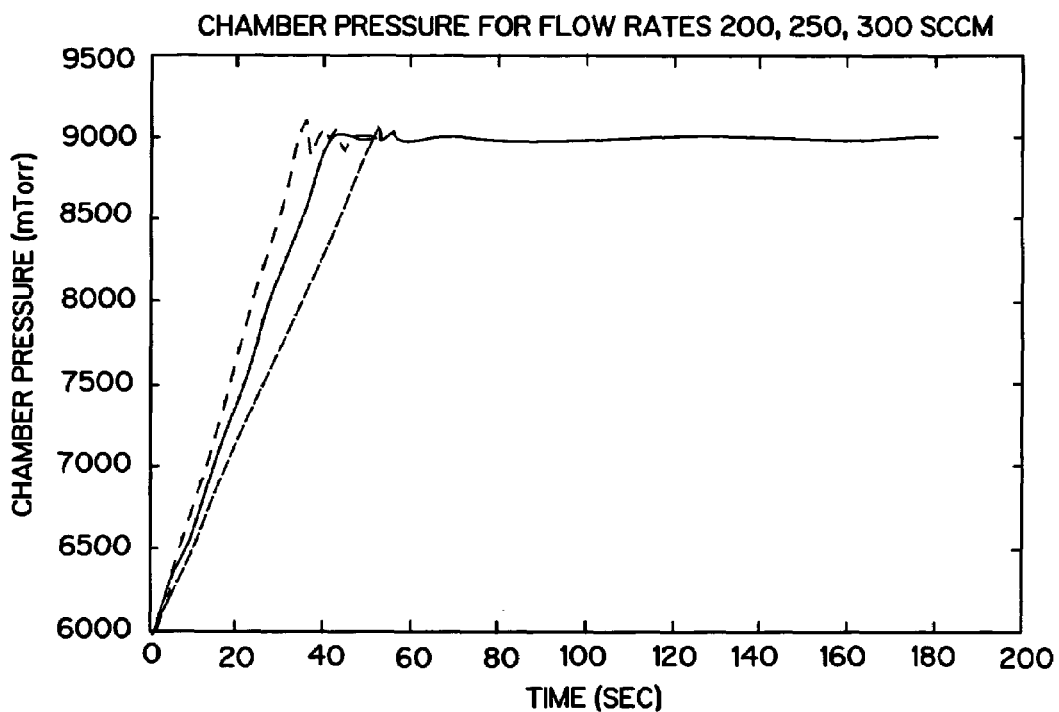
FIG. 6 shows the chamber pressure transient behavior for a third pressure setpoint change in accordance with embodiments of the invention.

When the pressure setpoint is changed, from 0 to 3 Torr, the pressure controller manipulates the main valve opening to achieve the target pressure. Initially, the controller action completely shuts the value. Under these conditions, the pressure rise rate becomes a function of gas flow rate also and independent of the valve angle. Exemplary results are shown in FIG. 4, FIG. 5, and FIG. 6. FIG. 4 shows the chamber pressure transient behavior for a pressure setpoint change from 0 to 3 Torr. FIG. 5 shows the chamber pressure transient behavior for a pressure setpoint change from 3 to 6 Torr. FIG. 6 shows the chamber pressure transient behavior for a pressure setpoint change from 6 to 9 Torr.

There are three sets of data—for each pressure step response, the pressure rise rate is measured for a 200, 250, and 300 sccm gas flow rate. This data can be used to obtain a consistent mathematical model of pressure rise rate vs. gas flow rate. For example, a linear relationship can be used:

$$y=ax+b,$$

where y=pressure rise rate (mTorr/sec) and x=gas flow rate (sccm). A linear least square fit yielded the results in Table 2.

TABLE 2

| Test case | Parameter "a" | Parameter "b" |
|---|---|---|
| 0 to 3 Torr | 0.292 | −1.4 |
| 3 to 6 Torr | 0.288 | −0.25 |
| 6 to 9 Torr | 0.289 | −0.47 |

Figure 7:
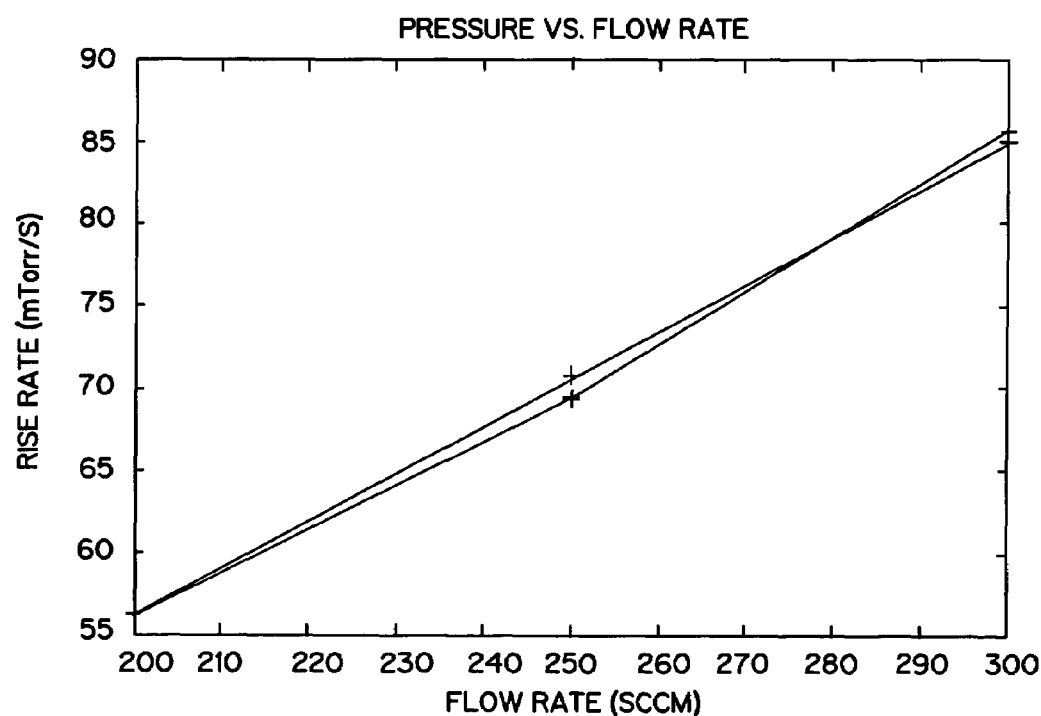
FIG. 7 shows rise rate as a function of gas flow rate for the three step response test cases in accordance with embodiments of the invention.

These results are also shown in FIG. 7 in which the rise rate is shown as a function for gas flow rate for the three step response test cases.

The parameter "b" should be ideally equal to zero—when there is no gas flow, the pressure rise rate should be zero. The measured value is a very small number around 1 sccm. The main parameter is "a". It is clear from the data in Table 2 that in this operating regime, the pressure rise rate can be modeled with a single set of parameters "a" and "b", independent of the gas flow rate, and this is one of the sub-models used in the BIST software. For example: the measured pressure rise rate is approximately equal to 75 mTorr/sec when the estimated gas flow rate is approximately equal to 258.6 sccm.

The system response under MVC can be determined, and a relationship of steady state pressure p as a function of gas flows and valve angle can be obtained using:

$$p = f_2(g_1, g_2, \ldots, g_n, v)$$

Figure 8:
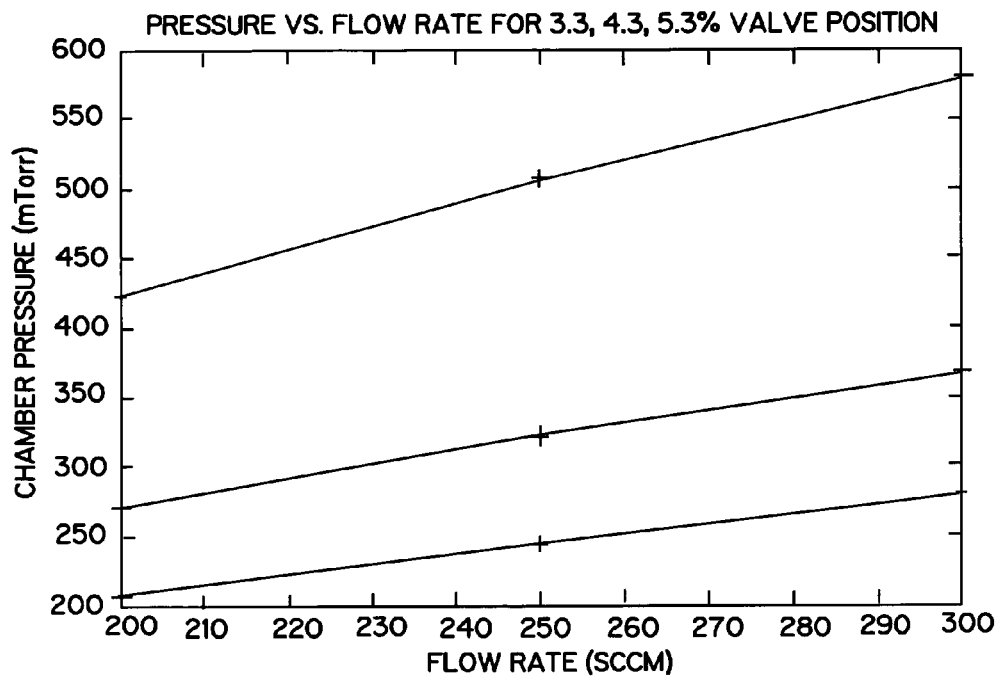
FIG. 8 shows chamber pressure as a function of flow rates at various valve angles in accordance with embodiments of the invention.

This function is expected to be quite nonlinear (unlike the linear function obtained for the pressure rise rate). In one case, specific values of this function can be empirically obtained under the following combination of conditions: for MFC flow rates of 200, 250, and 300 sccm and valve angles of 3.3, 4.3, and 5.3%. For example, the values obtained on one system are shown in Table 3, and the chamber pressure as a function of flow rates at various valve angles is illustrated in FIG. 8.

TABLE 3

|  | 3.3% | 4.3% | 5.3% |
|---|---|---|---|
| 200 | 423 | 270 | 206 |
| 250 | 506 | 321 | 244 |
| 300 | 578 | 367 | 279 |

In one embodiment, a real-time estimator methodology can be used. Alternately, other methods may be used. The semiconductor processing system and/or one or more of the system components or subsystem components can be modeled using a set of nonlinear differential equations $\dot{x}$ and an output equation y as follows:

$$\dot{x} = f(x, p, u) + w$$

$$y = g(x, p, u) + v$$

where: x is the state vector which can consist of temperatures, pressures, and reactant states; the vectors p consists of model parameters, such as heat capacity, thermal conductivity, and rate constants; the vector u consists of input applied to the process, such as heater powers; w is the additive white noise with zero mean, $E(w)=0$ ($E(\cdot)$ denotes the expectation operator), v is the additive white noise with zero mean, and $E(v)=0$.

Given the initial state $x_0$, input u, and parameters p, the differential equations can be integrated to compute the evolution of the state.

In addition, the models can be linearized for real-time applications. The linearization may lead to one or a set of models that describe the dynamics of the system along a nominal trajectory. These linear models are represented in state-space form by matrices $A_i$, $B_i$, and $C_i$ for each ith time interval. Thus, the nonlinear models are replaced by a sequence of discrete-time linear models:

$$x_{k+1} = A_i x_k + B_i u_k + w_k$$

$$y_k = C_i x_k + v_k$$

where k is a time index. The covariance of the initial state $P_0$ is $E\{x_0 x_0^T\} = P_0$, where T is the transposition operator.

A convenient method to build a real-time estimator is using Kalman filters matrices, $L_i$, which gives:

$$\hat{x}_{k+1} = A_i \hat{x}_k + B_i u_k + L_i(y - C_i \hat{x})$$

$$\hat{y}_k = C \hat{x}_k + v_k$$

where ^ indicates an estimated value.

When performing a steady-state check, the dynamic model of the system (without the noise terms) can be used, and the set of nonlinear differential equations $\dot{x}$ and an output equation y can be as follows:

$$\dot{x} = f(x, p, u)$$

$$y = g(x, p, u)$$

At some steady state, $\dot{x}=0$, and the steady-state values for the state, input, and output will be $x_s$, $u_s$, and $y_s$ respectively. Using known steady state values of the input and output for a reference system (e.g., $u_{ref}$ and $y_{ref}$), the steady-state values for any given system can be monitored and compared to the reference. In particular, if the feedback controller drives the system output to $y_{ref}$, the value of $u_s$ can be checked; that is:

Drive the outputs to the reference value    $y_s \to y_{ref}$, and hence $\|y_s - y_{ref}\| \leq \varepsilon$ Check the inputs to the reference value    Is $\|u_s - u_{ref}\| \leq \varepsilon$?

$\varepsilon$ is selected to be a sufficiently small value for the particular system.

If the difference is small, then the system under test (SUT) is operating like the reference system; otherwise, a possibility of an error condition is indicated.

For example, consider a reference furnace system with 5 zones; suppose on the reference furnace it has been determined that when all the zones are at 600° C., the heater power should be as shown in Table 4.

TABLE 4

| Zone | Power (W) |
|---|---|
| 1 | 1200 |
| 2 | 1300 |
| 3 | 1400 |
| 4 | 1400 |
| 5 | 1300 |

When a SUT furnace at the same five 600° C. temperature zones is reporting a heater power of 2600 W in zone 5, it is clear that some sort of error condition is indicated—the error condition could be with the heater zone, o-rings, etc., and must be diagnosed with further tests.

In one embodiment, a dynamic response check can be performed. As described herein, one way to detect error is to monitor the dynamic response of the system and compare to the reference. For example, a dynamic real-time estimator can be used for this purpose. Consider a linear estimator created with the reference system, where the estimates of the output are given by:

$$\hat{y}_k = C \hat{x}_k + v_k$$

When the SUT is producing outputs $y_k$, a check can be performed to determine if the two are close enough:

$$\text{Check the } SUT \text{ output with estimates of reference system} \quad \text{Is} \sum_{i=1}^{n} |y_k - \hat{y}_k| \text{ reasonably small?}$$

Thus, these models provide multiple estimates of the process parameters. The inference logic finds a consistent set of explanation for the estimated parameters to generate diagnostics.

The present invention provides a method to capture the dynamic and steady-state behavior of the furnace gas-flow system. The method involves running a "model-devlopment" recipe on the furnace—the recipe is designed to operate under a variety of condition in order to produce a number of BIST rules.

A key requirement for the processing of wafers is tight critical dimension (CD) control, tight profile control, and tight uniformity control—both wafer-in-wafer and wafer-to-wafer. For example, variations in CD measurements, profile measurements, and uniformity measurements are caused by variations in thermal profile across wafer zones and variations in thermal response from wafer to wafer.

Typically, bare silicon wafers are relatively flat and are manufactured within tight specifications. However, multiple films are deposited on wafers during multiple thermal processes, and as a result, wafers can acquire significant curvature. Wafer curvature can have an adverse impact on CD uniformity by creating problems during processing, including the lithography and developing process.

A BIST system can be used to detect wafer position errors and reject a wafer when it has excess curvature. The BIST system can use real-time data from one or more measurement devices in a "mathematical model" to estimate and/or compensate for wafer curvature, and the model can be static or dynamic, linear or nonlinear.

In one embodiment, the BIST system uses the dynamic response of the chamber as flat and/or warped wafers are positioned within and/or processed in the thermal processing chamber to detect, diagnose, and/or predict system performance. For example, wafers with different curvatures create different dynamic thermal responses when they are positioned within and/or processed in the thermal processing chamber.

In one embodiment, an "active" method is used. In this case, a combination of processing parameters (for example, control modes, temperature control zone set points, chamber zone power) can be actively varied, and the resultant dynamic response of the temperature field can be used to estimate and monitor wafer curvature. The variation of processing parameters is intended to bring out the information regarding wafer curvature.

Various active methods can be used. In a first active case, one or more test wafers can be loaded and/or processed to create different dynamic conditions of the thermal system, so that a dynamic model of the thermal response can be created, and it can be compared to previously computed thermal models to estimate system performance. In another case, multiple dynamic models can be run in real-time, and the estimation error between them and the measured thermal response can be examined to estimate wafer curvature. For example, these multiple dynamic models may have been previously created with real-time data from a reference system. In a third active case, the variation in the zone-to-zone thermal response, including the peak variation in temperature field can be examined. In a fourth case, the timing of these peak variations in addition to the value of the peak variations described above can be examined.

In addition, during the "active" mode, various measurement methods can be used. For example, the dynamic response of the temperature field can be measured to estimate and monitor system performance. For example, the thermal response of each zone can be measured, and the variation in the zone-to-zone thermal response, including the peak variation in temperature can be examined. In another case, the timing of these peak variations in addition to the value of the peak variations described above can be examined. In a third case, multiple dynamic models can be run in real-time, and the estimation error between them and historical data can be examined to estimate system performance. For example, the historical data may have been previously created with real-time data from the system.

In addition, other embodiments can be designed for both real-time and non-real-time comparisons. In a real-time method, system performance can be estimated and monitored in real time during processing of the wafer. In a non-real-time method, the data can be processed at a later time, and the system performance can be estimated and monitored after one or more of the wafers have been processed. In other embodiments, virtual sensors can be used to "measure" wafer temperatures in real-time and eliminate the need for instrumented wafers during production. For example, a virtual sensor can comprise a dynamic model component or a real-time model, a physical sensor component that measures a physical variable such as temperature, a manipulated variables component that regulates a variable such as applied voltage or power to the heater, and a software algorithm component that relates the dynamic model component in conjunction with information from the physical sensors and the manipulated variables. The virtual sensor may be viewed as a compound device comprising an algorithm-based consolidation of information from multiple "physical" sensors. The virtual sensor is an adaptive device that can provide historical data, real-time data, and predictive data.

Figure 9:
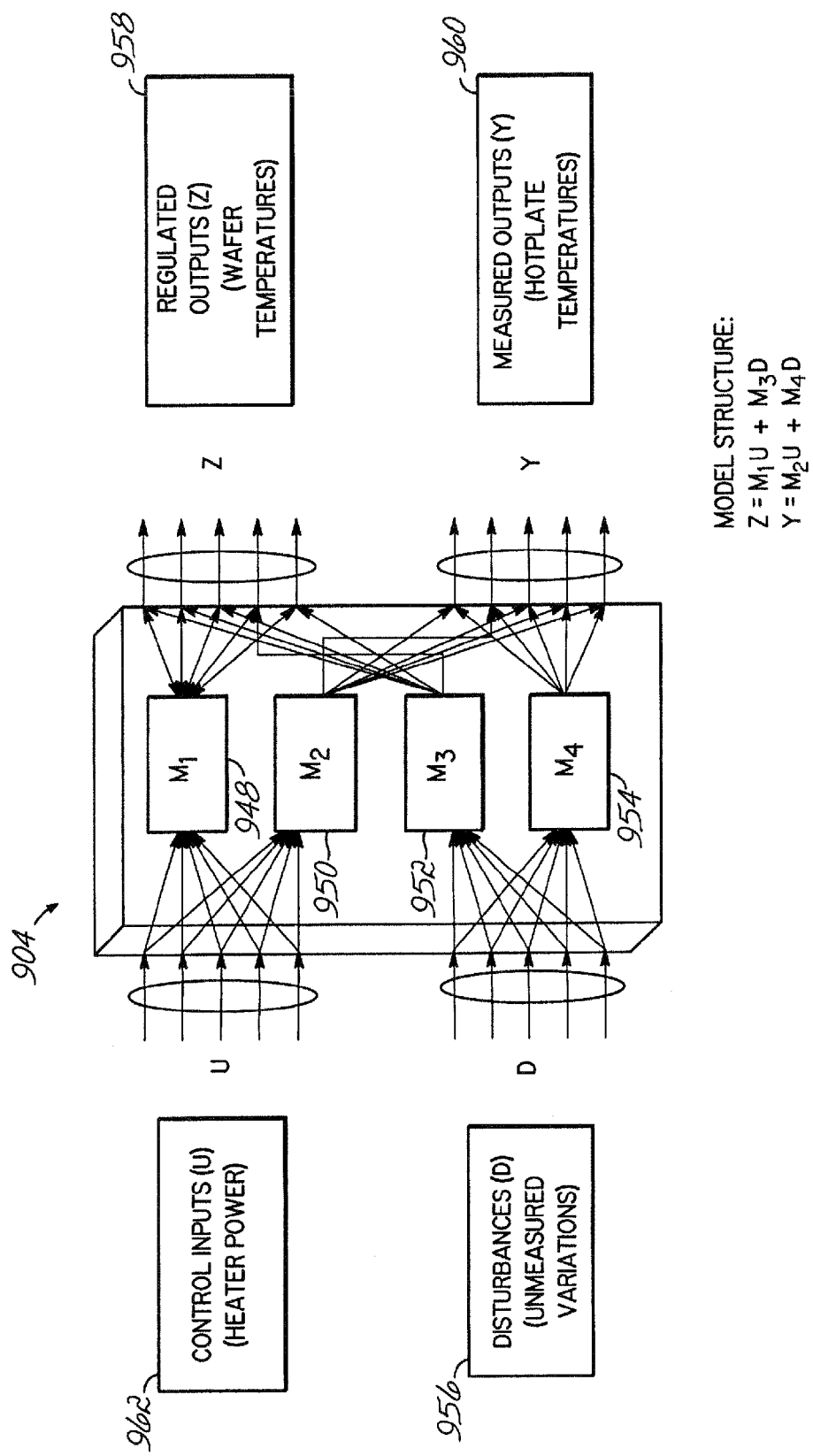
FIG. 9 illustrates a schematic representation of an embodiment of the dynamic model characterizing one or more of the responses of a thermal processing system in accordance with an embodiment of the invention.

FIG. 9 illustrates a schematic representation of an embodiment of the dynamic model characterizing one or more of the responses of a thermal processing system in accordance with an embodiment of the invention. In the illustrated embodiment, four nodes or model components ($M_1$, $M_2$, $M_3$, and $M_4$) 948, 950, 952, 954 are shown. However, in alternative embodiments of the invention, a different number of model components may be used, and the model components may be arranged with a different architecture.

In addition, the dynamic model 904 receives control inputs (U), such as heater power, chamber pressure, gas flow, and wafer information. The model also receives disturbance inputs (D) 956, such as unmeasured variations. The model determines regulated outputs (Z) 958, such as wafer temperatures, and measured outputs (Y) 960, such as chamber temperatures. The model structure may be expressed as $Z = M_1 U + M_3 D$ and $Y = M_2 U + M_4 D$. Alternately, a different expression for the model structure may be used.

The dynamic model 904 tracks the "state" of the system, and relates the inputs 962 to outputs 958, 960 in real-time. For example, U, Y may be measured, and by using the dynamic model 904, D may be estimated using $Y = M_2 U + M_4 D_{est}$ and Z may be estimated using $Z_{est} = M_1 U + M_3 D_{est}$.

When creating the dynamic model 904, wafer position, wafer curvature, and chamber effects may be incorporated into the model. For example, dynamic models 904 can be created using first principles models based on heat transfer, gas flow, and reaction kinetics, or on-line models created with real-time data collected from a processing system, such as a thermal processing system.

During model development, a first principles model may be implemented numerically on a suitable microprocessor in a suitable software simulation application, such as Matlab. The software application resides on a suitable electronic computer or microprocessor, which is operated so as to perform the physical performance approximation. However, other numerical methods are contemplated by the present invention.

A model-based linear or nonlinear multivariable control approach may be used to model the thermal doses in which the controller comprises a mathematical model of the system to be controlled. The multivariable controller may be based on any of the modern control design methods such as linear-quadratic-gaussian (LQG) method, linear quadratic regulator (LQR) method, H-infinity (H-inf) method, etc. The thermal dose model may be either linear or nonlinear and either SISO or MIMO. The multivariable control approach (i.e., MIMO) considers all inputs and their effects on the outputs. Several other approaches for modeling the thermal doses are available, such as physical models, and data-driven models.

Figure 10:
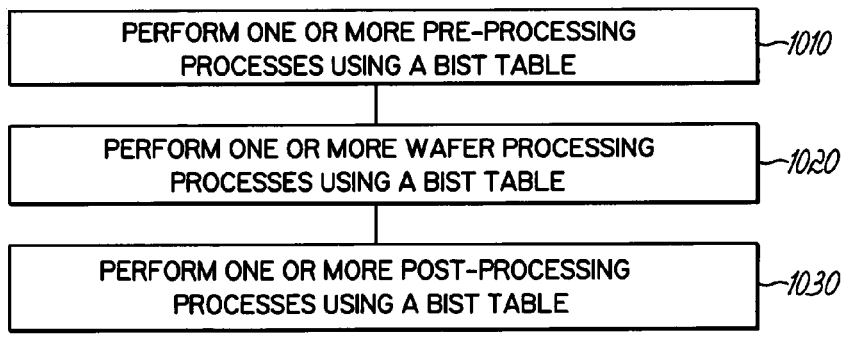
FIG. 10 illustrates a simplified flow diagram of a method of monitoring a thermal processing system in real-time using a built-in self test (BIST) table in accordance with embodiments of the invention.

FIG. 10 illustrates a simplified flow diagram of a method of monitoring a thermal processing system in real-time using a built-in self test (BIST) table in accordance with embodiments of the invention.

BIST tables can be established for the thermal processing system, the temperature control components, the pressure control components, gas supply components, mechanical components, computing components, or software components, or combinations thereof.

In 1010, one or more pre-processing processes can be performed on the wafers positioned in the processing chamber in the thermal processing system. The wafers can be positioned at different heights in the processing chamber, and the processing chamber can be sealed. The wafers can include production wafers, instrumented wafers, test wafers, or dummy wafers, or combinations thereof. Alternately, a plurality of wafers is not required. For example, a vertical boat can be used to position the wafers in a furnace.

During a pre-processing process, operational conditions can be established. For example, chamber pressure, chamber temperature, substrate temperature, and/or process gas conditions can be changed to operational values during a pre-processing process.

The thermal processing system can obtain pre-processing data and use the pre-processing data to establish one or more recipes to use during the pre-processing process. In addition, the operational data can include dynamic and/or static modeling information for predicting the performance of the thermal processing system during the pre-processing process. Furthermore, the data can include measured and/or predicted data from previous runs.

In addition, the pre-processing data can include recipe data, historical data, wafer data, such as critical dimension (CD) data, profile data, thickness data, uniformity data, and optical data, such as refractive index (n) data and extinction coefficient (k) data. Wafer data can also include the number of layers, layer position, layer composition, layer uniformity, layer density, and layer thickness. Layers can include semiconductor material, resist material, dielectric material, and/or metallic material. In addition, data can comprise correction data, error data, measurement data, or historical data, or a combination of two or more thereof.

During a pre-processing process, a process can be performed in which one or more of the processing parameters are changed from a first value to a second value. One or more pre-processing real-time dynamic models can exist that can be used to predict the system's response when a processing parameter is changed from a first value to a second value. The model can be based on the type of wafer boat, the type, position, and quantity of wafers, the type of thermal processing chamber, and/or the recipe to be performed. For example, the plurality of wafers can include curved and/or instrumented wafers, and the models can account for factors such as wafer curvature. When curved wafers are positioned in the boat, the gap between two curved wafers is variable, and the heat transfer and gas flow are also variable.

During a pre-processing process, a pre-processing real-time dynamic model can be executed to generate a predicted dynamic pre-processing process response. For example, the pre-processing real-time dynamic model can be executed to generate a predicted dynamic pre-processing process response when one or more of the processing parameters are changed from a first value to a second value during a pre-processing process. The dynamic model can be executed before, during, or after the pre-processing process is performed. When a pre-processing process is performed multiple times and/or multiple processes are performed, one or more different pre-processing dynamic models can be executed.

One or more measured dynamic pre-processing process responses can be created during a pre-processing process. The measured dynamic pre-processing process response can be created each time one or more of the processing parameters is changed from a first value to a second value during a pre-processing process. When a pre-processing process is performed multiple times, one or more different measured dynamic pre-processing process responses can be created.

In addition, a pre-processing dynamic estimation error can be determined using a difference between a predicted dynamic pre-processing process response and a measured dynamic pre-processing process response each time one or more of the processing parameters is changed during a pre-processing process.

Furthermore, the pre-processing dynamic estimation error can be compared to operational thresholds established by one or more rules in a BIST table each time a new pre-processing dynamic estimation error is determined during a pre-processing process. The pre-processing process can continue when the pre-processing dynamic estimation error is within the operational thresholds established by one or more rules in the BIST table. In this case, the thermal processing system is operating within the operational limits during the pre-processing process.

The pre-processing dynamic estimation error determined for the pre-processing process can be compared to warning thresholds when the pre-processing dynamic estimation error is not within the operational thresholds established by one or more rules in the BIST table. For example, when an error exceeds an operational limit but does not exceed a warning limit, a warning message can be sent, and when an error exceeds an operational limit and also exceeds a warning limit, a fault message can be sent.

In one embodiment, a warning message can be sent, and the pre-processing process can continue when the pre-processing dynamic estimation error is within a warning threshold established by one or more rules in the BIST table. In another embodiment, a warning message can be sent and the pre-processing process can be paused when the pre-processing dynamic estimation error is within a warning threshold established by one or more rules in the BIST table. In this case, the thermal processing system is operating outside the operational limits but within the warning limits during the pre-processing process. For example, this can occur when a component is degrading or a process is drifting. The pre-processing process can resume when a continue processing message is received.

In one embodiment, a fault message can be sent and the pre-processing process can be stopped when the pre-processing dynamic estimation error determined for the pre-processing process is not within a warning threshold established by one or more rules in the BIST table. In this case, the thermal processing system is operating outside both the operational limits and the warning limits during the pre-processing process. For example, this can occur when a component has failed or the system was not setup properly. The pre-processing process can be re-started when a restart message is received.

During a pre-processing process, the pressure in the processing chamber can be changed from a first pressure to an operating pressure. For example, a chamber pressure error can occur if the chamber is not sealed properly. In addition, the processing chamber temperature can be changed from a first temperature to an operational temperature during a pre-processing process. For example, a chamber temperature error can occur if the heater has failed. Furthermore, the chamber chemistry can be changed during a pre-processing process. For example, a chamber chemistry error can occur if a gas supply system component has failed.

In 1020, one or more thermal wafer processing processes can be performed on the wafers positioned in the processing chamber. The wafers can be positioned at different heights in the processing chamber, and a thermal processing process can be performed. The wafers can include production wafers, instrumented wafers, test wafers, or dummy wafers, or combinations thereof. For example, the thermal process can be a film-forming and/or deposition process, and a process gas can be introduced into the processing chamber. Alternately, a different process can be performed.

The thermal processing system can obtain operational data and use the operational data to establish one or more recipes to use when processing the wafers. In addition, the operational data can include dynamic and/or static modeling information for predicting the performance of the thermal processing system during a process. Furthermore, the data can include measured and/or predicted data from previous runs.

During wafer processing, one or more processes can be performed in which one or more of the processing parameters are changed from a first operational value to a second operational value or maintained at operational values.

During wafer processing, a real-time dynamic model can be executed to generate a predicted dynamic wafer process response. For example, the wafer processing real-time dynamic model can be executed to generate a predicted dynamic wafer process response when one or more of the processing parameters are changed from a first value to a second value during a process or maintained at operational values. The dynamic wafer model can be executed before, during, or after a process is performed. When a process is performed multiple times, one or more different wafer dynamic models can be executed.

One or more measured dynamic wafer process responses can be created during wafer processing. A measured dynamic wafer process response can be created each time one or more of the processing parameters is changed from a first operational value to a second operational value during a process. When a process is performed multiple times, one or more different measured dynamic wafer process responses can be created.

In addition, a wafer processing dynamic estimation error can be determined using a difference between a predicted dynamic wafer process response and a measured dynamic wafer process response each time one or more of the processing parameters is changed or maintained during a process.

Furthermore, the wafer processing dynamic estimation error can be compared to operational thresholds established by one or more rules in a BIST table each time a new wafer processing dynamic estimation error is determined during wafer processing. Wafer processing can continue when the wafer processing dynamic estimation error is within operational thresholds established by one or more rules in the BIST table. In this case, the thermal processing system is operating within the operational limits during wafer processing.

The wafer processing dynamic estimation error can be compared to warning thresholds when the wafer processing dynamic estimation error is not within operational thresholds established by one or more rules in the BIST table. For example, when an error exceeds an operational limit but does not exceed a warning limit, a warning message can be sent, and when an error exceeds an operational limit and also exceeds a warning limit, a fault message can be sent.

In one embodiment, a warning message can be sent, and the wafer processing can continue when the wafer processing dynamic estimation error is within the warning thresholds established by one or more rules in the BIST table. In another embodiment, a warning message can be sent, and the wafer processing can be paused when the wafer processing dynamic estimation error is within the warning thresholds established by one or more rules in the BIST table. In this case, the thermal processing system is operating outside the operational limits but within the warning limits during wafer processing. For example, this can occur when a component is degrading, a chamber needs cleaning, or a process is drifting. Wafer processing can resume when a command is received.

In one embodiment, a fault message can be sent and the wafer processing can be stopped when the wafer processing dynamic estimation error is not within the warning thresholds established by one or more rules in the BIST table. In this case, the thermal processing system is operating outside both the operational limits and the warning limits during the wafer processing. For example, this can occur when a passive, active, or software component has failed. The wafer processing can be re-started when a restart message is received.

During wafer processing, the pressure in the processing chamber can be maintained within operational limits established by a process recipe. For example, a chamber pressure error can occur if the chamber leak occurs or an exhaust system component fails. In addition, the processing chamber temperature can be maintained within operational limits established by a process recipe during wafer processing. For example, a chamber temperature error can occur if a power source, a heater element, or a sensor has failed. Furthermore, the chamber chemistry can be maintained within operational limits established by a process recipe during wafer processing. For example, a chamber chemistry error can occur if a gas supply system component has failed.

In 1030, one or more post-processing processes can be performed while the wafers are still positioned in the processing chamber. For example, the post-processing processes can be used to prepare for the unloading of the wafers from the processing chamber. Alternately, the post-processing processes may include the unloading of the wafers from the processing chamber.

The thermal processing system can obtain post-processing data and use the post-processing data to establish one or more recipes to use when post-processing the wafers. In addition, the post-processing data can include dynamic and/or static modeling information for predicting the performance of the thermal processing system during a post-processing process. The data can include measured and/or predicted data from previous runs.

During a post-processing process, a process can be performed in which one or more of the processing parameters are changed from a first value, for example an operational value, to a second value.

During a post-processing process, a real-time dynamic model can be executed to generate a predicted dynamic post-processing process response. The post-processing real-time dynamic model can be executed to generate a predicted dynamic post-processing process response when one or more of the processing parameters are changed from a first value to a second value during a post-processing process. The post-processing dynamic model can be executed before, during, or after the post-processing process is performed. When a post-processing process is performed multiple times, one or more different post-processing dynamic models can be executed.

One or more measured dynamic post-processing process responses can be created during a post-processing process. The measured dynamic post-processing process response can be created each time one or more of the processing parameters is changed from a first value to a second value during a post-processing process. When a post-processing process is performed multiple times, one or more different measured dynamic post-processing process responses can be created.

In addition, a post-processing dynamic estimation error can be determined using a difference between a predicted dynamic post-processing process response and a measured dynamic post-processing process response each time one or more of the processing parameters is changed during a post-processing process.

Furthermore, the post-processing dynamic estimation error can be compared to operational thresholds established by one or more rules in a BIST table each time a new post-processing dynamic estimation error is determined during a post-processing process. The post-processing process can continue when the post-processing dynamic estimation error is within the operational thresholds established by one or more rules in the BIST table. In this case, the thermal processing system is operating within the operational limits during the post-processing process.

The post-processing dynamic estimation error can be compared to warning thresholds when the post-processing dynamic estimation error is not within the operational thresholds established by one or more rules in the BIST table. For example, when an error exceeds an operational limit but does not exceed a warning limit, a warning message can be sent, and when an error exceeds an operational limit and also exceeds a warning limit, a fault message can be sent.

In one embodiment, a warning message can be sent, and the post-processing process can continue when the post-processing dynamic estimation error is within the warning thresholds established by one or more rules in the BIST table. In another embodiment, a warning message can be sent and the post-processing process can be paused when the post-processing dynamic estimation error is within the warning thresholds established by one or more rules in the BIST table. In this case, the thermal processing system is operating outside the operational limits but within the warning limits during the post-processing process. For example, this can occur when a component is degrading or a process is drifting. The post-processing process can resume when a command is received.

In one embodiment, a fault message can be sent and the post-processing process can be stopped when the-post-processing dynamic estimation error is not within the warning thresholds established by one or more rules in the BIST table. In this case, the thermal processing system is operating outside both the operational limits and the warning limits during the post-processing process. For example, this can occur when a component has failed. The post-processing process can be re-started when a restart command is received.

During a post-processing process, the pressure in the processing chamber can be changed from an operational pressure to another pressure. For example, a chamber pressure error can occur if the chamber is not sealed properly or is opened too soon. In addition, the processing chamber temperature can be changed from an operational temperature to another temperature during a post-processing process. For example, a chamber temperature error can occur if a heating and/or cooling element has failed. Furthermore, the chamber chemistry can be changed during a post-processing process. For example, a chamber chemistry error can occur if a gas supply system component has failed.

In addition, the plurality of wafers can be removed from the processing chamber in the thermal processing system after or during a post-processing process.

When a process parameter is changed from a first value to a second value, the change can occur in a series of steps. One or more real-time dynamic models can be executed to generate a predicted dynamic process response for each step. One or more measured dynamic process responses can be created for each step, and a series of dynamic estimation errors can be determined using differences between the predicted dynamic process responses and the measured dynamic process responses. The dynamic estimation errors can be compared to operational thresholds established by one of the rules in the BIST table. The process can be stopped when one or more of the dynamic estimation errors is not within operational thresholds established by at least one of the rules in the BIST table, and the process can continue when one or more of the dynamic estimation errors is within operational thresholds established by at least one of the rules in the BIST table.

In one embodiment, when the process is paused because a dynamic estimation error is not within operational thresholds established by at least one of the rules in the BIST table, the real-time dynamic model used to generate the predicted dynamic process response, the measured dynamic process response, and/or the dynamic estimation error can be examined, and a new BIST rule with operational thresholds based on the dynamic estimation error can be established. In addition, the new BIST rule can be entered into the BIST table, and the process can be continued. Furthermore, the process can be stopped when a new BIST rule with operational thresholds based on the dynamic estimation error cannot be created. Alternately, the process can continue.

In another embodiment, when the process is paused because a dynamic estimation error is not within operational thresholds established by at least one of the rules in the BIST table, a new real-time dynamic model can be selected and used to generate a new predicted dynamic process response. The new dynamic estimation error can be compared to operational thresholds established by one or more rules in a BIST table. The process can be stopped when the new dynamic estimation error is not within operational thresholds established by at least one of the rules in the BIST table, and the process can continue when the new dynamic estimation error is within operational thresholds established by at least one of the rules in the BIST table.

When the process is paused because a new dynamic estimation error is not within operational thresholds established by at least one of the rules in the BIST table, the new real-time dynamic model used to generate the new predicted dynamic process response, the measured dynamic process response, and/or the new dynamic estimation error can be examined, and a new BIST rule with operational thresholds based on the new dynamic estimation error can be established. In addition, the new BIST rule can be entered into the BIST table, and the process can be continued. Furthermore, the process can be stopped when a new BIST rule with operational thresholds based on the new dynamic estimation error cannot be created. Alternately, the process can continue.

The set of predicted dynamic process responses can comprise a predicted dynamic thermal profile, a predicted dynamic chamber pressure, a predicted dynamic gas flow, a predicted chamber chemistry, or a predicted process time, or a combination thereof.

When the measured dynamic process response includes pressure, a pressure profile can be established for the chamber volume. Alternately, a pressure profile may be established for a processing volume. The volume can be divided into a plurality of temperature control zones, and substantially equal pressures can be established for all of the temperature control zones.

In one example, a chamber pressure change rate $\dot{p}$ can be modeled as:

$$\dot{p} = f_1(g_1, g_2, \ldots, g_n, v)$$

where $g_1$-$g_n$ are each process parameters other than chamber pressure, v is a valve angle opening measured in percent, and p is the process chamber pressure measured in mTorr.

When the measured dynamic process response includes chamber temperature, a temperature profile can be established for the chamber volume. Alternately, a temperature profile may be established for a processing volume. The volume can be divided into a plurality of temperature control zones, and different temperatures can be established for one or more of the temperature control zones. Alternately, substantially equal temperatures may be established for all of the temperature control zones. For example, a temperature profile can be established based on historical data for this type of wafer, and the historical data can include a reference temperature profile.

In another example, a chamber temperature change rate $\dot{T}$ can be modeled as:

$$\dot{T} = f_2(g_1, g_2, \ldots, g_n, h)$$

where $g_1$-$g_n$ are each process parameters other than chamber temperature, h represents the heater powers in percent, and T is the process chamber temperature measured in degrees Celsius.

When the measured dynamic process response includes a flow rate into and/or through the chamber, a flow profile can be established for the chamber volume. Alternately, a flow profile may be established for a processing volume. The volume can be divided into a plurality of zones, and different flow models can be established for one or more of the zones. For example, a flow profile can be established based on historical data for this type of process, and the historical data can include a reference flow profile.

In another example, a flow rate change rate $\dot{R}$ can be modeled as:

$$\dot{R} f_2(g_1, g_2, \ldots, g_n, p, v)$$

where $g_1$-$g_n$ are each process parameters other than flow rate, p is process chamber pressure measured in mTorr, v is a valve angle opening measured in percent, and R represents reactant concentrations.

When the measured dynamic process response includes wafer temperature, a temperature profile can be established for each wafer in the chamber. Alternately, a temperature profile may not be established for each wafer in the chamber. The volume can be divided into a plurality of temperature control zones, and different temperatures can be established for the wafers in the different temperature control zones. Alternately, substantially equal temperatures may be assumed for all of the wafers. For example, a temperature profile can be established based on historical data for this type of wafer, and the historical data can include a reference temperature profile.

Figure 11:
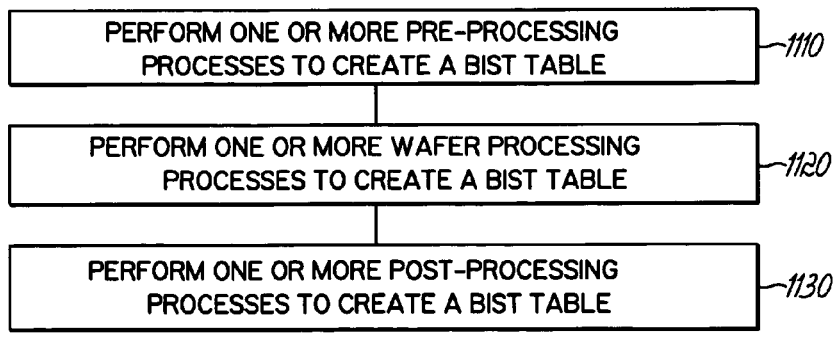
FIG. 11 illustrates a simplified flow diagram of a method of creating a built-in self test (BIST) table for the real-time monitoring of a thermal processing system in accordance with embodiments of the invention.

FIG. 11 illustrates a simplified flow diagram of a method of creating a built-in self test (BIST) table for the real-time monitoring of a thermal processing system in accordance with embodiments of the invention.

BIST tables can be established for the thermal processing system, the temperature control components, the pressure control components, gas supply components, mechanical components, computing components, or software components, or combinations thereof.

When creating a BIST table, a process can be performed in which one or more of the processing parameters are changed from a first value to a second value. For example, the first value and/or second value can be chosen to establish a normal, warning, or fault condition to occur during a pre-processing process. In other cases, the first value and/or second value can be chosen to magnify and/or amplify an error during a pre-processing process.

A BIST rule can be structured as follows:
Error<=Operational Threshold (OT) defines an Operational Condition;
Error>(OT) and <=Warning Threshold (WT) defines Warning Condition;
Error>(WT) defines a Fault Condition.
Alternately, other structures can be used.

A number of processes can be performed a number of times to establish operational thresholds and warning thresholds that are expected to occur during one or more processes, and a set of BIST rules can be created using the set of expected dynamic error conditions and their associated operational thresholds and warning thresholds.

One set of processes can be used to characterize system performance when the thermal processing system is operating within the operational limits during a process. In this case, the dynamic estimation errors are less than the operational thresholds. For example, a number of processes can be performed a number of times to establish operational thresholds. These processes can be performed with process parameters within operational limits. These processes can produce a set of errors expected during "normal" operation, and the set of expected errors can be used to establish the operational thresholds. For example, operational thresholds can be made large enough to allow for some process variation. DOE techniques can be used to minimize the number of processes required to generate operational thresholds.

Another set of processes can be used to characterize system performance when the thermal processing system is operating just outside the operational limits during a process. In these cases, the dynamic estimation errors can be greater than the operational thresholds and less than the warning thresholds. For example, a second set of processes can be performed a number of times to establish warning thresholds. These processes can be performed with one or more process parameters just outside the operational limits. These processes can produce a set of errors expected when the system performance is deviated slightly from "normal" operation, and the set of errors can be used to establish the warning thresholds. For example, warning thresholds can be made large enough to allow some process drift and/or component degradation, and warning thresholds can be made small enough to ensure that high quality wafers are produced. The warning thresholds can also be used to predict and prevent failures from occurring. DOE techniques can be used to minimize the number of processes required to generate warning thresholds.

In 1110, one or more pre-processing processes can be performed on the wafers positioned in the processing chamber in the thermal processing system. The wafers can be positioned at different heights in the processing chamber, and the processing chamber can be sealed. The wafers can include production wafers, instrumented wafers, test wafers, or dummy wafers, or combinations thereof. Alternately, a plurality of wafers is not required.

The thermal processing system can obtain pre-processing data and use the pre-processing data to establish one or more recipes to use during a pre-processing process. In addition, the operational data can include dynamic and/or static modeling information for predicting the performance of the thermal processing system during the pre-processing process. Furthermore, the data can include measured and/or predicted data from previous runs. During a pre-processing process operational conditions can be established. For example, chamber pressure, chamber temperature, substrate temperature, and/or process gas conditions can be changed to operational values.

In addition, the data can include dynamic and/or static modeling information for predicting the performance of the thermal processing system during the pre-processing process. Furthermore, the data can include measured and/or predicted data from previous runs.

When creating BIST rules for a pre-processing process, a measured dynamic pre-processing process response can be created while pre-processing the plurality of wafers. In one embodiment, one or more process parameters can be dynamically changed from a first value to a second value at a first rate, and the values remain within operating limits established for the pre-processing process. Alternatively, different rates can be used.

A pre-processing real-time dynamic model can be executed to generate a predicted dynamic pre-processing process response for the plurality of wafers when the one or more process parameters are dynamically changed from the first value to the second value.

A pre-processing dynamic estimation error can be determined for the pre-processing process using a difference between the predicted dynamic pre-processing process response and the measured dynamic pre-processing process response. In addition, the pre-processing dynamic estimation error can be examined to determine if it can be associated with a BIST rule in the BIST table.

A new BIST rule can be created for the pre-processing process when the pre-processing dynamic estimation error cannot be associated with a BIST rule in the BIST table, and the pre-processing process can be stopped when a new BIST rule cannot be created.

In addition, new operational thresholds can be established for the new BIST rule. In one embodiment, the new operational thresholds for the new BIST rule are based on the operational thresholds used to compare the pre-processing dynamic estimation error determined for the pre-processing process. Alternatively, new operational thresholds may be determined independently.

In one embodiment, new warning thresholds can be established based on the new operational thresholds. Alternatively, new warning thresholds may be determined independently.

A warning message can be created and associated with the new BIST rule. For example, this warning message can be sent when the pre-processing dynamic estimation error is outside the operational thresholds but within the new warning thresholds established for the new BIST rule. A fault message can also be created and associated with the new BIST rule. For example, this fault message can be sent when the pre-processing dynamic estimation error is not within the new warning thresholds established for the new BIST rule.

Furthermore, a new pre-processing real-time dynamic model can be executed to generate a new predicted dynamic pre-processing process response for the plurality of wafers during the pre-processing process that can be used to establish a new pre-processing dynamic estimation error and associated new BIST rule. A new measured dynamic pre-processing process response can be created for the plurality of wafers during the pre-processing process that can be used to establish a new pre-processing dynamic estimation error and associated new BIST rule.

During a pre-processing process, the pressure in the processing chamber can be dynamically changed from a first pressure to an operating pressure. For example, a BIST rule can monitor chamber pressure error and a warning or fault message can be sent when the chamber is not sealed properly. In addition, the processing chamber temperature can be changed from a first temperature to an operational temperature during a pre-processing process. For example, a BIST rule can monitor chamber temperature error and a warning or fault message can be sent when the heater has failed. Furthermore, the chamber chemistry can be changed during a pre-processing process. For example, BIST rule can monitor chamber chemistry error and a warning or fault message can be sent when a gas supply system component has failed.

The rule creation can be stopped when the pre-processing dynamic estimation errors determined during the pre-processing process are all within operational thresholds established by one or more rules in the BIST table. The rule creation can continue and one or more new rules can be created when a pre-processing dynamic estimation error is not within operational thresholds established by one or more rules in the BIST table.

In 1120, one or more wafer processing processes can be performed while the wafers are positioned in the processing chamber. The wafers can be positioned at different heights in the processing chamber, and a thermal process can be performed. The wafers can include production wafers, instrumented wafers, test wafers, or dummy wafers, or combinations thereof. For example, the thermal process can be a film-forming and/or deposition process. Alternately, a different process can be performed.

The thermal processing system can obtain wafer processing data and use the data to establish one or more recipes to use when processing the wafers. In addition, the data can include dynamic and/or static modeling information for predicting the performance of the thermal processing system during a thermal process. Furthermore, the data can include measured and/or predicted data from previous runs.

During wafer processing, a process can be performed in which one or more of the processing parameters are changed from a first value to a second value or maintained at an operational value. When creating a BIST table, the first value and/or second value, or the operational value, can be chosen to force a warning and/or fault condition to occur during wafer processing. In other cases, the first value and/or second value can be chosen to magnify and/or amplify an error during wafer processing.

When creating BIST rules for a wafer processing process, a measured dynamic wafer process response can be created while wafer processing the plurality of wafers. In one embodiment, at least one process parameter is maintained at an operational value during the wafer processing process. Alternatively, one or more process parameters can be dynamically changed from a first value to a second value at a first rate, and the values remain within operating limits established by a process recipe for the wafer processing process.

A wafer processing real-time dynamic model can be executed to generate a predicted dynamic wafer process response for the plurality of wafers when the one or more process parameters are dynamically changed from the first value to the second value, or maintained at the operational value.

A wafer processing dynamic estimation error can be determined for the wafer processing process using a difference between the predicted dynamic wafer process response and the measured dynamic wafer process response. In addition, the wafer processing dynamic estimation error can be examined to determine if it can be associated with a BIST rule in the BIST table.

A new BIST rule can be created for the wafer processing process when the wafer processing dynamic estimation error cannot be associated with a BIST rule in the BIST table, and the wafer processing process can be stopped when a new BIST rule cannot be created.

In addition, new operational thresholds can be established for the new BIST rule. In one embodiment, the new operational thresholds for the new BIST rule are based on the operational thresholds used to compare the wafer processing dynamic estimation error determined for the wafer processing process. Alternatively, new operational thresholds may be determined independently.

In one embodiment, new warning thresholds can be established based on the new operational thresholds. Alternatively, new warning thresholds may be determined independently.

A warning message can be created and associated with the new BIST rule. For example, this warning message can be sent when a wafer processing dynamic estimation error is outside the operational thresholds but within the new warning thresholds established for the new BIST rule. A fault message can also be created and associated with the new BIST rule. For example, this fault message can be sent when a wafer processing dynamic estimation error is not within the new warning thresholds established for the new BIST rule.

Furthermore, a new wafer processing real-time dynamic model can be executed to generate a new predicted dynamic wafer process response for the plurality of wafers during the wafer processing process that can be used to establish a new wafer processing dynamic estimation error and associated new BIST rule. A new measured dynamic wafer process response can be created for the plurality of wafers during the wafer processing process that can be used to establish a new wafer processing dynamic estimation error and associated new BIST rule.

During a wafer processing process, the pressure in the processing chamber can be dynamically changed from a first pressure to an operating pressure. For example, a BIST rule can monitor chamber pressure error and a warning or fault message can be sent when the chamber is not sealed properly. In addition, the processing chamber temperature can be changed from a first temperature to an operational temperature during a wafer processing process. For example, a BIST rule can monitor chamber temperature error and a warning or fault message can be sent when the heater has failed. Furthermore, the chamber chemistry can be changed during a wafer processing process. For example, a BIST rule can monitor chamber chemistry error and a warning or fault message can be sent when a gas supply system component has failed.

A number of wafer processing processes can be performed a number of times to establish operational thresholds for a set of error conditions that are expected to occur during one or more wafer processing processes, and a set of BIST rules can be created using the set of expected error conditions and their associated thresholds. In addition, wafer processing processes can be performed a number of times to establish operational thresholds for a set of error conditions that are less likely to occur during a wafer processing process, and a set of BIST rules can be created using the set of less likely error conditions and their associated thresholds.

The rule creation can be stopped when the wafer processing dynamic estimation errors determined during the wafer processing process are all within operational thresholds established by one or more rules in the BIST table. The rule creation can continue and one or more new rules can be created when a wafer processing dynamic estimation error is not within operational thresholds established by one or more rules in the BIST table.

In 1130, one or more post-processing processes can be performed while the wafers are still positioned in the processing chamber. For example, the post-processing processes can be used to prepare for the unloading of the wafers from the processing chamber. Alternately, the post-processing processes may include the unloading of the wafers from the processing chamber.

The thermal processing system can obtain post-processing data and use the post-processing data to establish one or more recipes to use when post-processing the wafers. In addition, the post-processing data can include dynamic and/or static modeling information for predicting the performance of the thermal processing system during a post-processing process. The data can include measured and/or predicted data from previous runs.

When creating BIST rules for a post-processing process, a measured dynamic post-processing process response can be created while post-processing the plurality of wafers. In one embodiment, one or more process parameters can be dynamically changed from a first value to a second value at a first rate, and the values remain within operating limits established for the post-processing process. Alternatively, different rates can be used.

A post-processing real-time dynamic model can be executed to generate a predicted dynamic post-processing process response for the plurality of wafers when the one or more process parameters are dynamically changed from the first value to the second value.

A post-processing dynamic estimation error can be determined for the post-processing process using a difference between the predicted dynamic post-processing process response and the measured dynamic post-processing process response. In addition, the post-processing dynamic estimation error can be examined to determine if it can be associated with a BIST rule in the BIST table.

A new BIST rule can be created for the post-processing process when the post-processing dynamic estimation error cannot be associated with a BIST rule in the BIST table, and the pre-processing process can be stopped when a new BIST rule cannot be created.

In addition, new operational thresholds can be established for the new BIST rule. In one embodiment, the new operational thresholds for the new BIST rule are based on the operational thresholds used to compare the post-processing dynamic estimation error determined for the post-processing process. Alternatively, new operational thresholds may be determined independently.

In one embodiment, new warning thresholds can be established based on the new operational thresholds. Alternatively, new warning thresholds may be determined independently.

A warning message can be created and associated with the new BIST rule. For example, this warning message can be sent when a post-processing dynamic estimation error is outside the operational thresholds but within the new warning thresholds established for the new BIST rule. A fault message can also be created and associated with the new BIST rule. For example, this fault message can be sent when a post-processing dynamic estimation error is not within the new warning thresholds established for the new BIST rule.

Furthermore, a new post-processing real-time dynamic model can be executed to generate a new predicted dynamic post-processing process response for the plurality of wafers during the post-processing process that can be used to establish a new post-processing dynamic estimation error and associated new BIST rule. A new measured dynamic post-processing process response can be created for the plurality of wafers during the post-processing process that can be used to establish a new post-processing dynamic estimation error and associated new BIST rule.

During a post-processing process, the pressure in the processing chamber can be dynamically changed from an operating pressure to another pressure. For example, a BIST rule can monitor chamber pressure error and a warning or fault message can be sent when the chamber is not sealed properly. In addition, the processing chamber temperature can be changed from an operating temperature to another temperature during a post-processing process. For example, a BIST rule can monitor chamber temperature error and a warning or fault message can be sent when the heater has failed. Furthermore, the chamber chemistry can be changed during a post-processing process. For example, BIST rule can monitor chamber chemistry error and a warning or fault message can be sent when a gas supply system component has failed.

The rule creation can be stopped when the post-processing dynamic estimation errors are all within operational thresholds established by at least one of the rules in the BIST table. The rule creation can continue and one or more new rules can be created when a post-processing dynamic estimation error is not within operational thresholds established by at least one of the rules in the BIST table.

Actual and/or virtual sensors can be used to create a measured dynamic process response. For example, a measured dynamic process response for the processing chamber can include measuring temperature for each of the plurality of temperature control zones. Alternately, measurements may not be required for each zone. In other embodiments, optical techniques can be used to measure temperature in the chamber and/or the wafer temperature.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the scope of applicants' general inventive concept.

What is claimed is:

1. A method of creating and/or modifying a built-in self test (BIST) table for monitoring a thermal processing system in real-time, comprising:

positioning a plurality of wafers at different heights in a processing chamber in the thermal processing system;

creating a measured dynamic pre-processing process response while subjecting the plurality of wafers to a pre-processing process, wherein at least one first process parameter is changed from a first value to a second value within operating limits established for the pre-processing process;

executing a pre-processing real-time dynamic model to generate a predicted dynamic pre-processing process response for the plurality of wafers when the at least one first process parameter is changed from the first value to the second value;

determining a pre-processing dynamic estimation error for the pre-processing process using a difference between the predicted dynamic pre-processing process response and the measured dynamic pre-processing process response; and determining if the pre-processing dynamic estimation error can be associated with a pre-existing first BIST rule in the BIST table having one or more pre-existing first operational thresholds and first warning thresholds, and when the pre-processing dynamic estimation error cannot be associated with any pre-existing first BIST rule in the BIST table, either creating a new first BIST rule for the pre-processing process, or stopping the pre-processing process when a new first BIST rule cannot be created.

2. The method of claim 1, further comprising:

creating a measured dynamic wafer process response while subjecting the plurality of wafers to a wafer processing process, wherein at least one second process parameter is maintained at an operational value during the wafer processing process;

executing a wafer processing real-time dynamic model to generate a predicted dynamic wafer process response for the plurality of wafers during the wafer processing process;

determining a wafer processing dynamic estimation error for the wafer processing process using a difference between the predicted dynamic wafer process response and the measured dynamic wafer process response; and determining if the wafer processing dynamic estimation error can be associated with a pre-existing second BIST rule in the BIST table having one or more pre-existing second operational thresholds and second warning thresholds, and when the wafer processing dynamic estimation error cannot be associated with any pre-existing second BIST rule in the BIST table, either creating a new second BIST rule for the wafer processing process, or stopping the wafer processing process when a new second BIST rule cannot be created.

3. The method of claim 2, further comprising:

creating a measured dynamic post-processing process response while subjecting the plurality of wafers to a post-processing process, wherein at least one third process parameter is changed from an operational value during a post-processing process;

executing a post-processing real-time dynamic model to generate a predicted dynamic post-processing process response for the plurality of wafers during the post-processing process;
determining a post-processing dynamic estimation error for the post-processing process using a difference between the predicted dynamic post-processing process response and the measured dynamic post-processing process response; and
determining if the post-processing dynamic estimation error can be associated with a pre-existing third BIST rule in the BIST table having one or more pre-existing third operational thresholds and third warning thresholds, and when the post-processing dynamic estimation error cannot be associated with any pre-existing third BIST rule in the BIST table, either
creating a new third BIST rule for the post-processing process, or
stopping the post-processing process when a new third BIST rule cannot be created.

4. The method of claim 1, further comprising:
establishing new first operational thresholds for the new first BIST rule, wherein the new first operational thresholds are based on the pre-existing first operational thresholds;
establishing new first warning thresholds based on the new first operational thresholds;
creating a warning message to associate with the new first BIST rule, wherein the warning message is configured to be sent when a pre-processing dynamic estimation error determined during a pre-processing process is within the new first warning thresholds established for the new first BIST rule; and
creating a fault message to associate with the new first BIST rule, wherein the fault message is configured to be sent when a pre-processing dynamic estimation error determined during a pre-processing process is not within the new first warning thresholds established for the new first BIST rule.

5. The method of claim 1, further comprising:
executing a new pre-processing real-time dynamic model to generate a new predicted dynamic pre-processing process response for the plurality of wafers during the pre-processing process;
determining a new pre-processing dynamic estimation error for the pre-processing process using a difference between the new predicted dynamic pre-processing process response and the measured dynamic pre-processing process response; and
determining if the new pre-processing dynamic estimation error can be associated with any pre-existing first BIST rule in the BIST table, and when the new pre-processing dynamic estimation error cannot be associated with any pre-existing first BIST rule in the BIST table, either
creating a new first BIST rule for the pre-processing process, or
stopping the pre-processing process when a new first BIST rule cannot be created.

6. The method of claim 5, further comprising:
establishing new first operational thresholds for the new first BIST rule, wherein the new first operational thresholds are based on the pre-existing first operational thresholds;
establishing new first warning thresholds based on the new first operational thresholds;
creating a warning message to associate with the new first BIST rule, wherein the warning message is configured to be sent when a pre-processing dynamic estimation error determined during a pre-processing process is within the new first warning thresholds established for the new first BIST rule; and
creating a fault message to associate with the new first BIST rule, wherein the fault message is configured to be sent when a pre-processing dynamic estimation error determined during a pre-processing process is not within the new first warning thresholds established for the new first BIST rule.

7. The method of claim 1, further comprising:
creating a new measured dynamic pre-processing process response for the plurality of wafers during the pre-processing process when the process parameter is changed to a third value outside the operating limits established for the pre-processing process;
determining a new pre-processing dynamic estimation error for the pre-processing process using a difference between the predicted dynamic pre-processing process response and the new measured dynamic pre-processing process response;
determining if the new pre-processing dynamic estimation error can be associated with any pre-existing first BIST rule in the BIST table, and when the new pre-processing dynamic estimation error cannot be associated with any pre-existing first BIST rule in the BIST table, either
creating a new first BIST rule for the pre-processing process, or
stopping the pre-processing process when a new first BIST rule cannot be created.

8. The method of claim 2, further comprising:
establishing new second operational thresholds for the new second BIST rule, wherein the new second operational thresholds are based on the pre-existing second operational thresholds;
establishing new second warning thresholds based on the new second operational thresholds;
creating a warning message to associate with the new second BIST rule, wherein the warning message is configured to be sent when a wafer processing dynamic estimation error determined during a wafer processing process is within the new second warning thresholds established for the new second BIST rule; and
creating a fault message to associate with the new second BIST rule, wherein the fault message is configured to be sent when a wafer processing dynamic estimation error determined during a wafer processing process is not within the new second warning thresholds established for the new second BIST rule.

9. The method of claim 2, further comprising:
executing a new wafer processing real-time dynamic model to generate a new predicted dynamic wafer process response for the plurality of wafers during the wafer processing process;
determining a new wafer processing dynamic estimation error for the wafer processing process using a difference between the new predicted dynamic wafer process response and the measured dynamic wafer process response; and
determining if the new wafer processing dynamic estimation error can be associated with any pre-existing second BIST rule in the BIST table, and when the new wafer processing dynamic estimation error cannot be associated with any pre-existing second BIST rule in the BIST table, either
creating a new second BIST rule for the wafer processing process, or stopping the wafer processing process when a new second BIST rule cannot be created.

10. The method of claim 9, further comprising:
establishing new second operational thresholds for the new second BIST rule, wherein the new second operational thresholds are based on the pre-existing second operational thresholds;
establishing new second warning thresholds based on the new second operational thresholds;
creating a warning message to associate with the new second BIST rule, wherein the warning message is configured to be sent when a wafer processing dynamic estimation error determined during a wafer processing process is within the new second warning thresholds established for the new second BIST rule; and
creating a fault message to associate with the new second BIST rule, wherein the fault message is configured to be sent when a wafer processing dynamic estimation error determined during a wafer processing process is not within the new second warning thresholds established for the new second BIST rule.

11. The method of claim 2, further comprising:
creating a new measured dynamic wafer process response for the plurality of wafers during the wafer processing process when the second process parameter is changed to a non-operational value outside operating limits established for the wafer processing process;
determining a new wafer processing dynamic estimation error for the wafer processing process using a difference between the predicted dynamic wafer process response and the new measured dynamic wafer process response;
determining if the new wafer processing dynamic estimation error can be associated with any pre-existing second BIST rule in the BIST table, and when the new wafer processing dynamic estimation error cannot be associated with any pre-existing second BIST rule in the BIST table, either
creating a new second BIST rule for the wafer processing process, or
stopping the wafer processing process when a new second BIST rule cannot be created.

12. The method of claim 3, further comprising:
establishing new third operational thresholds for the new third BIST rule, wherein the new third operational thresholds are based on the pre-existing third operational thresholds;
establishing new third warning thresholds based on the new third operational thresholds;
creating a warning message to associate with the new third BIST rule, wherein the warning message is configured to be sent when a post-processing dynamic estimation error determined during a post-processing process is within the new third warning thresholds established for the new third BIST rule; and
creating a fault message to associate with the new third BIST rule, wherein the fault message is configured to be sent when a post-processing dynamic estimation error determined during a post-processing process is not within the new third warning thresholds established for the new third BIST rule.

13. The method of claim 3, further comprising:
executing a new post-processing real-time dynamic model to generate a new predicted dynamic post-processing process response for the plurality of wafers during the post-processing process;
determining a new post-processing dynamic estimation error for the post-processing process using a difference between the new predicted dynamic post-processing process response and the measured dynamic post-processing process response; and
determining if the new post-processing dynamic estimation error can be associated with any pre-existing third BIST rule in the BIST table, and when the new post-processing dynamic estimation error cannot be associated with any pre-existing third BIST rule in the BIST table, either
creating a new third BIST rule for the post-processing process, or
stopping the post-processing process when a new third BIST rule cannot be created.

14. The method of claim 13, further comprising:
establishing new third operational thresholds for the new third BIST rule, wherein the new third operational thresholds are based on the pre-existing third operational thresholds;
establishing new third warning thresholds based on the new third operational thresholds;
creating a warning message to associate with the new third BIST rule, wherein the warning message is configured to be sent when a post-processing dynamic estimation error determined during a post-processing process is within the new third warning thresholds established for the new third BIST rule; and
creating a fault message to associate with the new third BIST rule, wherein the fault message is configured to be sent when a post-processing dynamic estimation error determined during a post-processing process is not within the new third warning thresholds established for the new third BIST rule.

15. The method of claim 3, further comprising:
creating a new measured dynamic post-processing process response for the plurality of wafers during the post-processing process when the third process parameter is changed to a non-operational value outside operating limits established for the post-processing process;
determining a new post-processing dynamic estimation error for the post-processing process using a difference between the predicted dynamic post-processing process response and the new measured dynamic post-processing process response;
determining if the new post-processing dynamic estimation error can be associated with any pre-existing third BIST rule in the BIST table, and when the new post-processing dynamic estimation error cannot be associated with any pre-existing third BIST rule in the BIST table, either
creating a new third BIST rule for the post-processing process, or
stopping the post-processing process when a new third BIST rule cannot be created.

16. The method of claim 3, wherein the at least one first, second and third process parameters each include chamber pressure and a chamber pressure change rate $\dot{p}$ is modeled as:

$$\dot{p}=f_1(g_1, g_2, \ldots, g_n, v)$$

where $g_1$-$g_n$ are each process parameters other than chamber pressure, v is a valve angle opening measured in percent, and p is the process chamber pressure measured in mTorr.

17. The method of claim 3, wherein the at least one first, second, and third process parameters each include chamber temperature and a chamber temperature change rate $\dot{T}$ is modeled as:

$$\dot{T}=f_1(g_1, g_2, \ldots, g_n, v)$$

where $g_1$-$g_n$ are each process parameters other than chamber temperature, v is a valve angle opening measured in percent, and T is the process chamber temperature measured in degrees Celsius.

18. The method of claim 1, further comprising:
changing the at least one first process parameter from the first value to the second value using a series of steps.

19. The method of claim 1, wherein the predicted dynamic pre-processing process response comprises a predicted dynamic thermal gradient, a predicted dynamic chamber pressure, a predicted dynamic gas flow, or a predicted process time, or a combination thereof.

20. The method of claim 1, wherein the processing chamber comprises a plurality of temperature control zones, and wherein the creating a measured dynamic pre-processing process response for the processing chamber comprises establishing a measured temperature for each of the plurality of temperature control zones.

21. The method of claim 1, wherein the processing chamber comprises a plurality of temperature control zones, and further comprising:
modeling a thermal interaction between the temperature control zones of the processing chamber; and
incorporating the model of the thermal interaction into the pre-processing real-time dynamic model.

22. The method of claim 1, further comprising:
modeling a thermal interaction between the processing chamber and an ambient environment; and
incorporating the model for the thermal interaction into the pre-processing real-time dynamic model.

23. The method of claim 1, further comprising:
modeling a thermal interaction between the plurality of wafers and a processing space within the processing chamber; and
incorporating the model for the thermal interaction into the pre-processing real-time dynamic model.

24. The method of claim 1, wherein the at least one first process parameter includes wafer curvature.

25. The method of claim 1, wherein at least one test wafer is included in the plurality of wafers.

26. The method of claim 1, further comprising:
receiving feed forward data; and
determining the pre-processing real-time dynamic model using the feed forward data.

27. The method of claim 1, further comprising:
receiving feedback data;
determining the pre-processing real-time dynamic model using the feedback data.

28. A computer-readable medium containing computer-executable instructions executable by a controller for:
positioning a plurality of wafers at different heights in a processing chamber in the thermal processing system;
creating a measured dynamic pre-processing process response while subjecting the plurality of wafers to a pre-processing process, wherein at least one first process parameter is changed from a first value to a second value within operating limits established for the pre-processing process;
executing a pre-processing real-time dynamic model to generate a predicted dynamic pre-processing process response for the plurality of wafers when the at least one first process parameter is changed from the first value to the second value;
determining a pre-processing dynamic estimation error for the pre-processing process using a difference between the predicted dynamic pre-processing process response and the measured dynamic pre-processing process response; and
determining if the pre-processing dynamic estimation error can be associated with a pre-existing first BIST rule in the BIST table having one or more pre-existing first operational thresholds and first warning thresholds, and when the pre-processing dynamic estimation error cannot be associated with any pre-existing first BIST rule in the BIST table, either
creating a new first BIST rule for the pre-processing process, or
stopping the pre-processing process when a new first BIST rule cannot be created.

29. A method of operating a controller in a thermal processing system configured to process a substrate, the method comprising the steps of:
instructing the thermal processing system to position a plurality of wafers at different heights in a processing chamber in the thermal processing system;
instructing the thermal processing system to create a measured dynamic pre-processing process response while subjecting the plurality of wafers to a pre-processing process, wherein at least one first process parameter is changed from a first value to a second value within operating limits established for the pre-processing process;
instructing the thermal processing system to execute a pre-processing real-time dynamic model to generate a predicted dynamic pre-processing process response for the plurality of wafers when the at least one first process parameter is changed from the first value to the second value;
instructing the thermal processing system to determine a pre-processing dynamic estimation error for the pre-processing process using a difference between the predicted dynamic pre-processing process response and the measured dynamic pre-processing process response;
instructing the processing system to determine if the pre-processing dynamic estimation error can be associated with a pre-existing first BIST rule in the BIST table having one or more pre-existing first operational thresholds and first warning thresholds, and when the pre-processing dynamic estimation error cannot be associated with any pre-existing first BIST rule in the BIST table, either
instructing the processing system to create a new first BIST rule for the pre-processing process, or
instructing the processing system to stop the pre-processing process when a new first BIST rule cannot be created.

* * * * *

UNITED STATES PATENT AND TRADEMARK OFFICE
CERTIFICATE OF CORRECTION

PATENT NO.       : 7,444,572 B2
APPLICATION NO.  : 11/217276
DATED            : October 28, 2008
INVENTOR(S)      : Sanjeev Kaushal et al.

It is certified that error appears in the above-identified patent and that said Letters Patent is hereby corrected as shown below:

Col. 9, line 47, "in response the execution" should read -- in response to the execution --.

Col. 12, line 49, "operated-using" should read -- operated using --.

Col. 15, line 48, "the vectors $p$ consists," should read -- the vector $p$ consists --.

Col. 22, line 48, "if the chamber leak occurs" should read -- if a chamber leak occurs --.

Col. 23, line 67, "the-post" should read -- the post --.

Col. 25, line 62, " $\dot{R} f_2 (g_1, g_2, ..., g_n, p, v)$ " should read -- $\dot{R} = f_2 (g_1, g_2, ..., g_n, p, v)$ --.

Signed and Sealed this

Third Day of November, 2009

David J. Kappos
*Director of the United States Patent and Trademark Office*